United States Patent [19]
Ho et al.

[11] Patent Number: 6,009,251
[45] Date of Patent: Dec. 28, 1999

[54] METHOD AND SYSTEM FOR LAYOUT VERIFICATION OF AN INTEGRATED CIRCUIT DESIGN WITH REUSABLE SUBDESIGNS

[75] Inventors: Wai-Yan Ho, Cupertino; Hongbo Tang, San Jose, both of Calif.

[73] Assignee: Synopsys, Inc., Mountain View, Calif.

[21] Appl. No.: 08/941,145

[22] Filed: Sep. 30, 1997

[51] Int. Cl.⁶ .................................................. G06F 17/50
[52] U.S. Cl. .................................................. 395/500.06
[58] Field of Search ........................... 395/500.02–500.19

[56] References Cited

U.S. PATENT DOCUMENTS

| | | | |
|---|---|---|---|
| 5,050,091 | 9/1991 | Rubin .................................. | 395/500.11 |
| 5,281,558 | 1/1994 | Bamji et al. ........................ | 395/500.03 |
| 5,528,508 | 6/1996 | Russell et al. ..................... | 395/500.09 |
| 5,544,067 | 8/1996 | Rostoker et al. ................... | 395/500.35 |
| 5,604,680 | 2/1997 | Bamji et al. ........................ | 395/500.09 |
| 5,625,564 | 4/1997 | Rogoyski ............................ | 395/500.02 |
| 5,629,861 | 5/1997 | Kim .................................... | 395/500.09 |
| 5,787,006 | 7/1998 | Chevallier et al. ................. | 395/500.06 |

OTHER PUBLICATIONS

Martin E. Newell, Daniel T. Fitzpatrick; "Exploiting Structure in Integrated Circuit Design Analysis"; Jan. 26, 1982; Xerox Palo Alto Research Centers and Computer Science Division University of California, Berkeley, 1982 Conference on Advanced Research in VLSI, M.I.T. pp. 84–92.

Nunes et al. ("A new approach to perform circuit verification using O(n) algorithms", IEEE, Proceedings of the 20th EUROMICRO Conference: System Architecture and Integrations, Sep 5, 1994, pp. 428–432).

Hedenstierna et al. ("The halo algorithm—an algorithm for hierarchical design of rule checking of VLSI circuits", IEEE Transactions on Computer–Aided Design of Integrated Circuits and Systems, vol. 12, No. 2, Feb. 1993, pp. 265–272).

Stevens et al.("An Integrated Approach for Hierarchical Verification of VLSI Mask Artwork", IEEE Journal of Solid–State Circuits, vol. Sc–20, No. 2, Apr. 1985, pp. 501–509).

Hedenstierna et al. ("The use of inverse layout trees for hierarchical design verification", IEEE International Conference on Computer–Aided Design, ICCAD–88, Nov. 7, 1988, pp. 534–537).

Goering ("Avant! Launches Hercules verification Tool", Electronic Engineering Times, No. 924, p. 100 (1–2), Oct. 21, 1996).

*Primary Examiner*—Kevin J. Teska
*Assistant Examiner*—Phallaka Kik
*Attorney, Agent, or Firm*—Wagner, Murabito & Hao LLP

[57] ABSTRACT

A method and system for performing layout verification on an integrated circuit (IC) design using reusable subdesigns. Many custom designed integrated circuits are designed and fabricated using a number of computer implemented automatic design processes. Within these processes, a high level design language (e.g., HDL or VHDL) description of the integrated circuit can be translated by a computer system into a netlist of technology specific gates and interconnections there between. The cells of the netlist are then placed spatially in an integrated circuit layout and the connections between the cells are routed using computerized place and route processes. Circuit designers next run layout verification tests on the layout to verify that the geometry and connectivity data of the design meets specific design rules and matches logically with the schematic representation. The present invention provides a method of layout verification where unchanged subdesigns of a hierarchical IC design can be reused upon subsequent verification processes of the same IC design. They are reused for both design rule checking (DRC) and layout versus schematic (LVS) comparison. By reusing some of the subcell designs, subsequent verification processes of the present invention can be performed very efficiently. To account for faults attributed to subcell interfaces, the present invention advantageously determines subcell overlap areas within the layout and selectively flattens and verifies these areas in addition to any subcell designs that were not previously validated. Further, the invention determines updated connectivity information for new subcell designs.

22 Claims, 21 Drawing Sheets

METHOD AND SYSTEM FOR LAYOUT VERIFICATION OF AN INTEGRATED CIRCUIT DESIGN WITH REUSABLE SUBDESIGNS

BACKGROUND OF THE INVENTION

(1) Field of the Invention

The present invention relates to the field of layout verification for an integrated circuit description. The integrated circuit description typically includes a listing of cell elements and interconnections there between and is stored as data within one or more computer readable memory units of a computer system.

(2) Prior Art

Many custom designed integrated circuits (IC), e.g., application specific integrated circuits (ASICs) or other custom IC circuits, are designed and fabricated using a number of various computer implemented automatic design processes. Within these processes, a high level design language description of the integrated circuit (e.g., HDL, VHDL, Verilog, etc.) can be translated by a computer system into a netlist of generic logic. The generic logic can then be translated into a netlist of technology specific gates and interconnections there between that represent the IC design. The netlist more specifically is a listing of circuit elements and their connectivity and is stored within computer memory units of a computer system.

The cells of the netlist are then placed spatially in an integrated circuit layout by a computer implemented placer and the connections between the cells are then routed through the appropriate areas of the layout by a computer implemented router. After place and route, the IC design is represented by specific geometries (e.g., transistors) and interconnections between the geometries. Once the IC design has been placed and routed, circuit designers run a battery of tests on the result to verify that the IC design meets specific design rules and matches logically with the schematic design. These tests are performed by a computer system in a process called layout verification. Layout verification is very important because it is one of the last tests performed before the integrated circuit design is committed to silicon.

The netlist containing the geometries and connectivity that is input to the layout verification processes is generally represented as hierarchical block of subdesigns with each individual subdesign comprising different parts of the integrated circuit. FIG. 1 illustrates one exemplary integrated circuit design 10 having four subcell designs (or subdesigns): B 14; C 20; D 16; and E 18. The top level, design A 12, includes in its description each subcell design (e.g., 14, 16, 18, 20) plus any local structures 22 which are included directly within the top level 12. Each of the subcell designs can also include, like the top level 12, other subcell designs and so on. Under this representation, each subcell design has one parent design and can have one or more child designs. Those subcell designs located at the bottom of the hierarchy are leaf cell designs and contain only the data (e.g., geometry and connectivity) that needs to be layout verified.

The subcell designs of a netlist 10 are typically represented as different files within a computer system's disk access unit (e.g., a disk drive). Therefore, a netlist that requires layout verification is stored as a multi-file database. For instance, the actual file representation of design A 12 can be a directory having descriptions of the local structures 22 stored therein and having disk references to the files that contain the information for subcell design B 14, subcell design C 20, subcell design D 16 and subcell design E 18. This data is transferred in streams within the computer system using a well known graphic design stream format (e.g., GDSII format). In the GDSII format, the parent-child representations of the subcell designs are maintained as the data is passed within the computer system and to the layout verification process.

In the past, integrated circuit designs 10 were passed through the layout verification process in their entirety using either a hierarchical layout verification process or using a flattened layout verification process. In the hierarchical layout verification process, all of the disk files that represent the subcell designs (e.g., 14–20) of the top level design 12 and the subdesigns of the subcell designs (14–20), etc., are passed through the layout verification process for design rule checking (DRC) and layout versus schematic (LVS) comparison. In hierarchical fashion, the data from the disk unit is processed in accordance with its position within the hierarchical tree of the IC design. During layout verification, several disk directories are read to obtain the entire netlist data. This is done on each file of the IC design 10 every time verification is required.

In flattened layout verification, all of the files representing the leaf cells of the design 10 are incorporated (merged) directly into the top level 12 design. Further, any local structure stored in any subcell is also merged upward into the root file 12. That is to say, all leaf cells are pushed into a single disk directory to form one large file in the GDSII format that contains only geometry and connectivity information. This, like the hierarchical method, requires that all disk files be processed for layout verification. This entirely flattened top level design 12, or file, is then passed through layout verification for design rule checking (DRC) and layout versus schematic (LVS) comparison.

Therefore, in both cases, hierarchical or flattened layout verification, the input to the layout verification process is the entire integrated circuit design 10 for each instance that verification is required. This is true even if only a small part of the IC design 10 had been modified since the last layout verification process was run.

The prior art method of layout verification over the entire chip design requires about 10 or 20 minutes to complete for relatively small circuit designs. However, over the past 10 years, circuit designs have been growing increasingly larger thereby requiring more layout verification processing time. Today, IC chip designs are routinely in the 20–40 million transistors. At these chip sizes, the prior art method of layout verification, that requires the entire IC design as input for each verification, is consuming about four to five hours of processing time per integrated circuit chip design. This long verification period is required each time the integrated circuit design is modified for any reason or to any extent. Therefore, the prior art layout verification procedure is very inefficient. It would be advantageous to provide a layout verification process that can operate more effectively on an integrated circuit design to reduce the layout verification processing period required to verify the IC design.

Accordingly, the present invention provides a layout verification process that operates efficiently on an integrated circuit design to reduce the layout verification process period required of a circuit designer. Further, the present invention provides such an efficient layout verification method that includes design rule checking and layout versus schematic verification. Moreover, the present invention provides a particularly efficient layout verification method for integrated circuit designs that are passed through a layout verification process for the second and subsequent times. These and other advantages of the present invention not specifically described above will become clear within discussions of the present invention herein.

SUMMARY OF THE INVENTION

A method and system are described for layout verification of an integrated circuit design using reusable subdesigns. Many custom designed integrated circuits, e.g., application specific integrated circuits (ASICs), are designed and fabricated using a number of computer implemented automatic design processes. Within these processes, a high level design language (e.g., HDL or VHDL) description of the integrated circuit can be translated by a computer system into a netlist of technology specific gates and interconnections there between. At this point the design is at the transistor level. The cells of the netlist are then placed spatially in an integrated circuit layout by a computer implemented placer and the connections between the cells are then routed through the appropriate places of the layout by a computer implemented router. Once the design has been placed and routed, circuit designers run a battery of tests on the result (e.g., geometry and connectivity data) to verify that the design meets specific design rules and matches logically with the schematic design. These tests are performed by a computer in a process called layout verification.

The present invention provides a method of layout verification where unchanged subdesigns of a hierarchical IC design can be reused upon subsequent verification processes of the same IC design. This is true for design rule checking (DRC) and for layout versus schematic (LVS) netlist comparison. By reusing some of the subcell designs, subsequent verification processes of the present invention can be performed very efficiently. To account for faults attributed to subcell interfaces, the present invention advantageously determines subcell overlap areas within the layout and selectively flattens and verifies these areas in addition to any subcell designs that were not previously validated. The invention also determines the connectivity interface between new subcell designs and other subcell designs.

The present invention also provides a method and system for aiding a user in performing subsequent layout verification on an IC design. During verification of a top level cell, previously verified subcell designs are automatically identified and not verified again thereby advantageously saving computer processing time. During the verification process of the present invention, verified subdesigns are automatically identified. A hierarchical manager is used to construct a hierarchical tree of the top cell and is used to aid in the determination of which subcell designs have been previously verified and which have not. Interconnections between the subcell designs are also identified.

For interface checking, the present invention determines areas of the identified subcell designs that overlap with one another. The overlapping subdesign areas are then flattened to the leaf level and their input and output pins are extracted for connectivity checking. This flattened data along with the interconnections between the subdesigns is passed to the layout verification stage and the LVS checker, respectively, for verification. Since only the overlapping areas and interconnections need to be verified (and any new subcell designs that were not previously verified), the layout verification process for the entire integrated circuit design is performed very efficiently in accordance with the present invention. During the above verification integration process, subdesigns that were previously verified separately and remain unmodified are reused by the layout verification process, e.g., they are not re-verified. Any subdesigns that were verified then modified or not verified at all (e.g., unrecognized) are processed through the DRC and LVS layout verification processes. It is appreciated that the verification integration processes of the present invention operate recursively in that cells of a subcell design that were already verified are reused even though they are contained within a parent cell that is a subcell to the top design level. In this case, new connectivity information is determined between the new subcell(s) and the other cells of the parent.

Specifically, embodiments of the present invention include a computer implemented method of verifying the layout of an integrated circuit design, the computer implemented method comprising the steps of: a) receiving a stream of layout information representing an integrated circuit layout design, the stream of information comprising a plurality of subcell designs having parent-child relationships; b) comparing names of the subcell designs against a history database and parsing and storing into a new database only those subcell designs that are not found within the history database, the history database representing previously parsed subcell designs; c) from the new and history databases, constructing a hierarchical tree of the subcell designs from the parent-child relationships; d) selecting a selected subcell design from the hierarchical tree; e) comparing the selected subcell design to indications within a validation store and performing design rule verification on the selected subcell design only if the selected subcell design is not indicated within a validation store, otherwise skipping the selected subcell design and obtaining a next selected subcell design; f) performing steps d)–e) for each subcell design of the hierarchical tree and generating a design rule verification report on the integrated circuit layout; and g) storing the geometry of each subcell design selected at step d) into the validation store that passed design rule verification.

DETAILED DESCRIPTION OF THE INVENTION

In the following detailed description of the present invention, a layout verification system having reusable subcell designs, numerous specific details are set forth in order to provide a thorough understanding of the present invention. However, it will be obvious to one skilled in the art that the present invention may be practiced without these specific details. In other instances, well known methods, procedures, components, and circuits have not been described in detail to avoid unnecessarily obscuring aspects of the present invention.

Notation and Nomenclature

Some portions of the detailed descriptions which follow are presented in terms of procedures, steps, logic blocks, processing, and other symbolic representations of operations on data bits within a computer memory, e.g., processes 200, 270, 410, 450, 500, 600, 660 and 692. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Computer System 112

Figure 1:
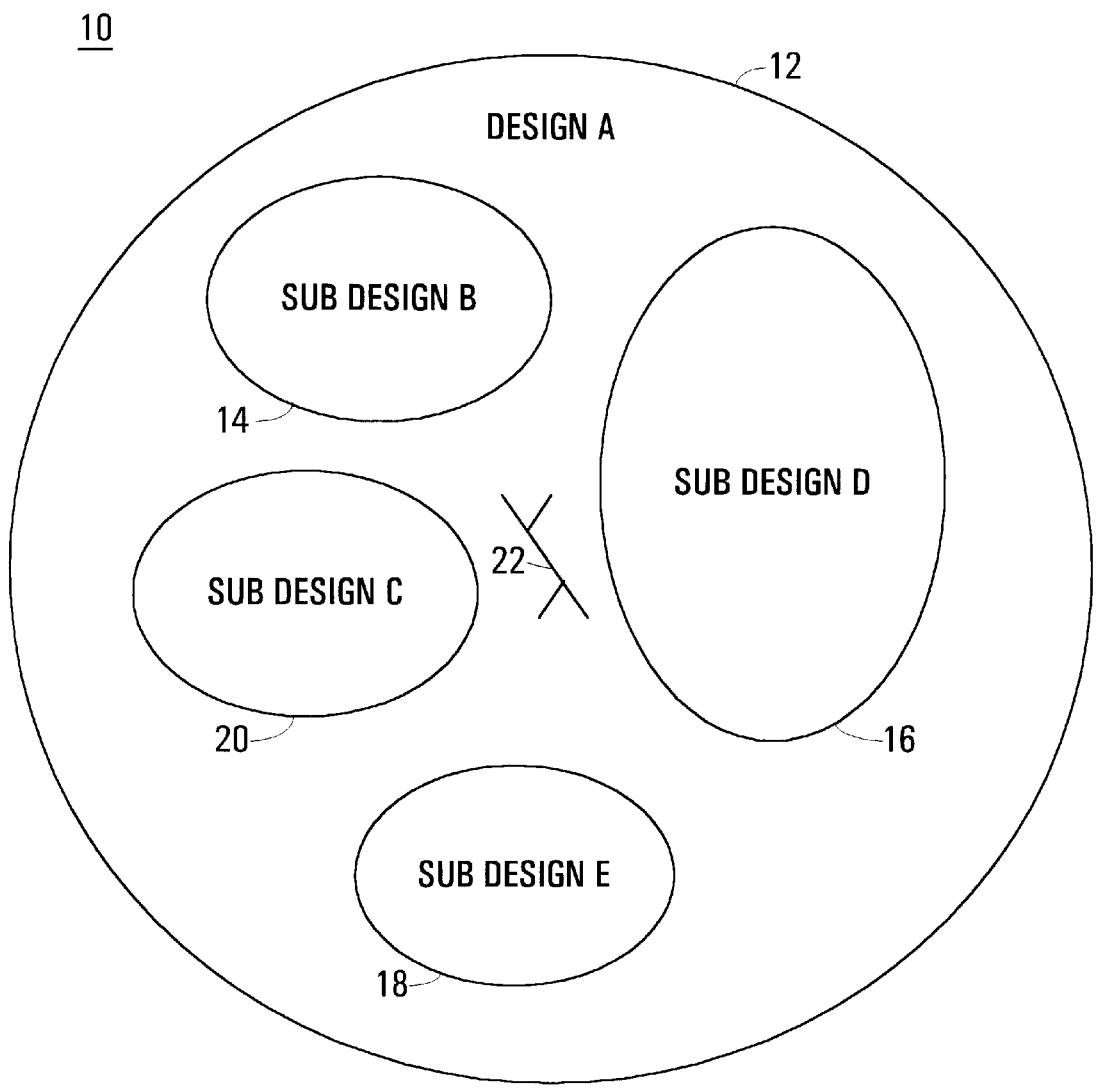
FIG. 1 illustrates a logical diagram of an integrated circuit design represented as a number of subcell designs.
Figure 2A:
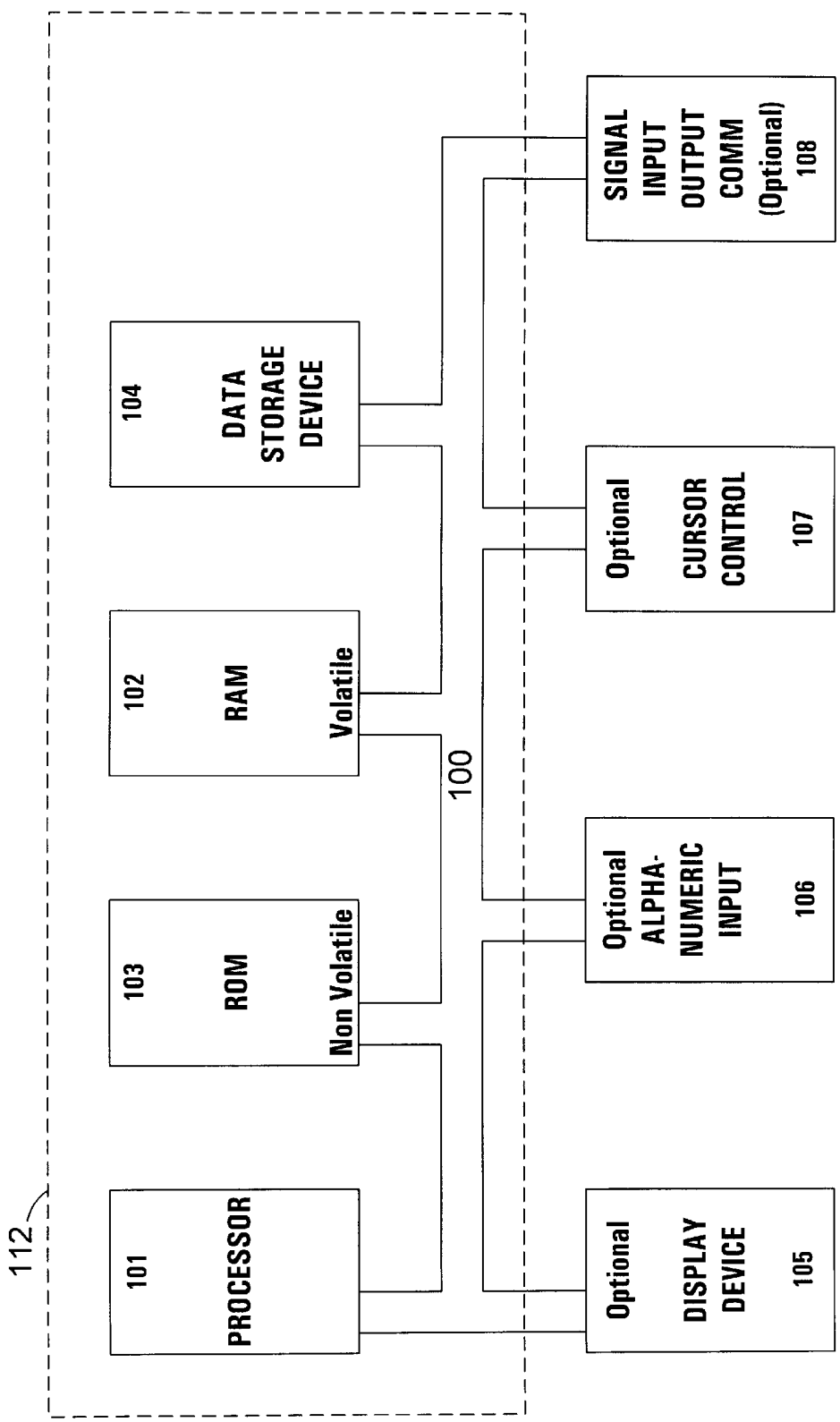
FIG. 2A illustrates a computer system on which embodiments of the present invention can be implemented.

With reference to the layout verification system with reusable subcell designs of the present invention, several aspects are described in terms of steps executed on a computer system. Although a variety of different computer systems can be used with the present invention, an exemplary computer system 112 is shown in FIG. 2A. In general, computer systems 112 that can be used by the present invention comprise an address/data bus 100 for communicating information, a central processor 101 coupled with the bus for processing information and instructions, a volatile memory 102 (e.g., random access memory) coupled with the bus 100 for storing information and instructions for the central processor 101, a non-volatile memory 103 (e.g., read only memory) coupled with the bus 100 for storing static information and instructions for the processor 101, a data storage device 104 such as a magnetic or optical disk and disk drive coupled with the bus 100 for storing information and instructions, a display device 105 coupled to the bus 100 for displaying information to the computer user, an optional alphanumeric input device 106 including alphanumeric and function keys coupled to the bus 100 for communicating information and command selections to the central processor 101, an optional cursor control device 107 coupled to the bus for communicating user input information and command selections to the central processor 101, and a signal generating device 108 coupled to the bus 100 for interfacing with other networked computer systems.

The display device 105 of FIG. 2A utilized with the computer system 112 of the present invention may be a liquid crystal device, cathode ray tube, or other display device suitable for creating graphic images and alphanumeric characters recognizable to the user.

Hierarchical Organized Netlist

Figure 2B:
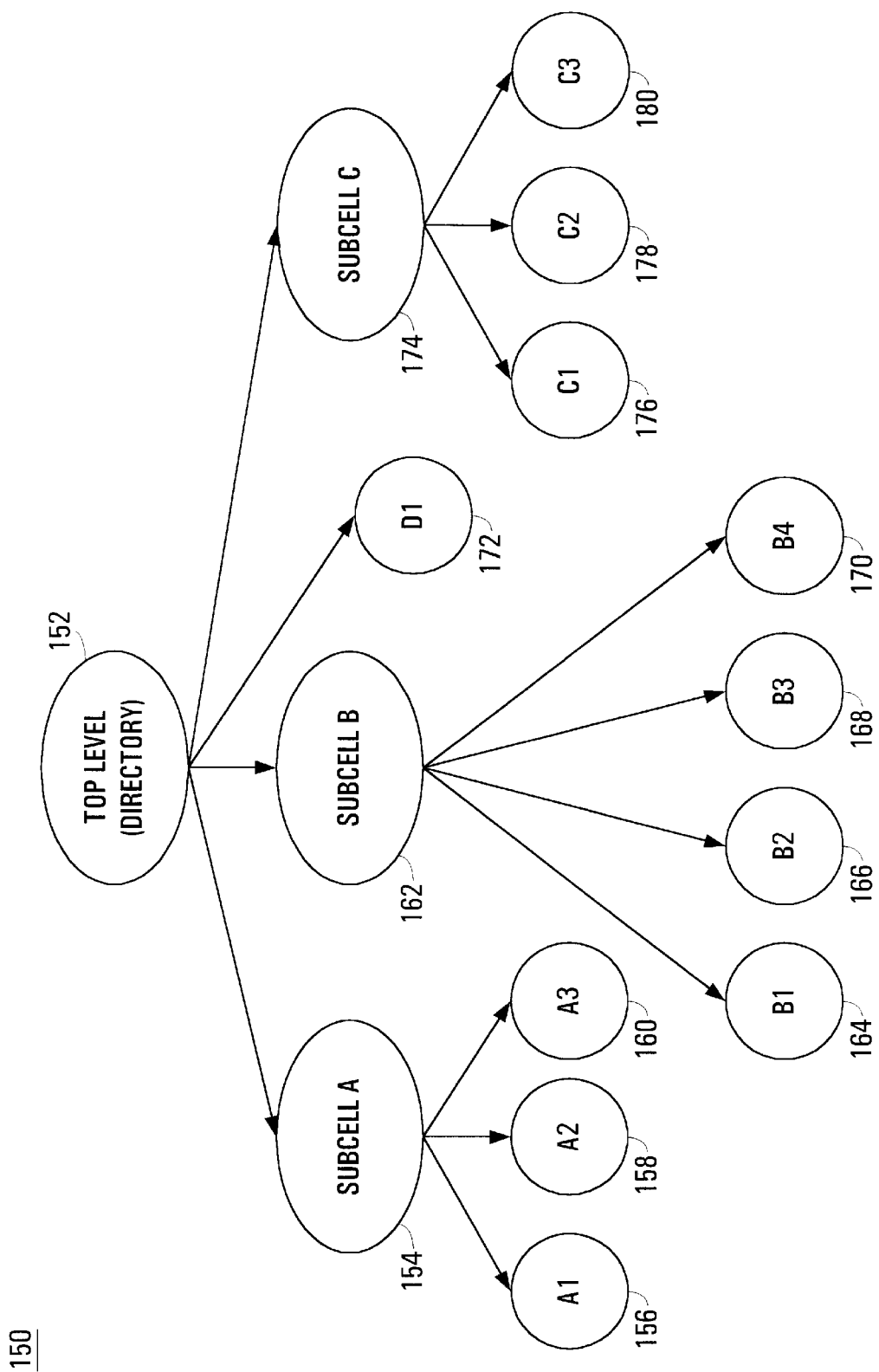
FIG. 2B is a hierarchical representation of subcell designs and their parent-child relationships of an integrated circuit design in accordance with the present invention.

An integrated circuit (IC) design in accordance with the present invention can be represented within by a netlist and organized with specific parent-child level relationships. One such parent-child hierarchical tree organization 150 is shown in FIG. 2B. Hierarchical tree organization 150 represents a netlist of geometric information and connectivity information regarding transistors and their connections which together represent the IC design at the substrate level. As described in more detail below, the layout verification procedures of the present invention are designed to efficiently process netlist 150 and report as to whether the netlist 150 violates any design rules or whether it validates without error.

Netlist 150 of FIG. 2B contains data regarding the geometry and interconnections of the represented IC design and this data is stored within a specific format called the GDSII format. The top level or directory 152 of netlist 150 contains specific references to subcell designs A 154, B 162, C 174 and subcell design D1 172. By so referencing, top level design 152 includes all geometry and connectivity information contained with each subcell design. Top level directory 152, as well as any subcell design, can also directly include local geometry and interconnections (e.g., structure) which represent circuitry logically situated within the top level directory 152 but not included in any referenced subdesign. The top level design 152 also includes a leaf cell D1 172. Leaf cells are subcells that contain only geometry and connectivity information and do not contain any references to other subcell designs. As such, leaf cells are located at the bottom of each branch of hierarchical tree 150.

Subcell design (e.g., directory) A 154 contains three leaf level cells A1 156, A2 158, and A3 160. Subcell design B 162 contains four leaf level cells B1 164, B2 166, B3 168 and B4 170. Subcell design C 174 contains three leaf level cells C1 176, C2 178, and C3 180. Each subcell design (of A 154, B 162 and C 174), in addition to the references to the leaf cells, can also include local geometry and interconnections (e.g., structure) which represent circuitry logically situated within the subcell design but not included in any referenced subcell. It is appreciated that each parent subcell design that references other child subcell designs also contains connectivity information regarding the manner in which the child subcells are connected together and/or connected to any local structure of the parent subcell.

Subcell designs within hierarchy 150 are stored as computer files within a disk drive unit (e.g., 104 of system 112). Typically each subcell design is stored as a separate file. Within the GDSII format, each respective subcell design parent includes a reference to the child subcell designs which are included within the respective subcell design. As described further below, each subcell design is also divided into a two dimensional array of individual bins (a bin array). Each child subcell design contains information regarding its spatial two dimensional position within the bin array of its parent. Each subcell design, for each of its own (e.g., local) bins, contains information regarding the geometries contained within each local bin and any child subcell designs that are located within each local bin. For subcell designs that are only partially located within a local bin, each local bin also includes information regarding which bins of the child subcell design are located within a particular local bin.

The netlist information shown in FIG. 2B is forwarded as a stream of data in GDSII format, subcell design by subcell design, to the layout verification process of the present invention. In this stream of information only the parent-child relationships between subcell designs are maintained. In one embodiment, the present invention advantageously identifies which subcells designs have not changed since the last layout verification of this netlist. These subdesigns are then skipped during a subsequent layout verification process thereby reducing the overall required verification time.

General EDA Flow Diagrams

Figure 3A:
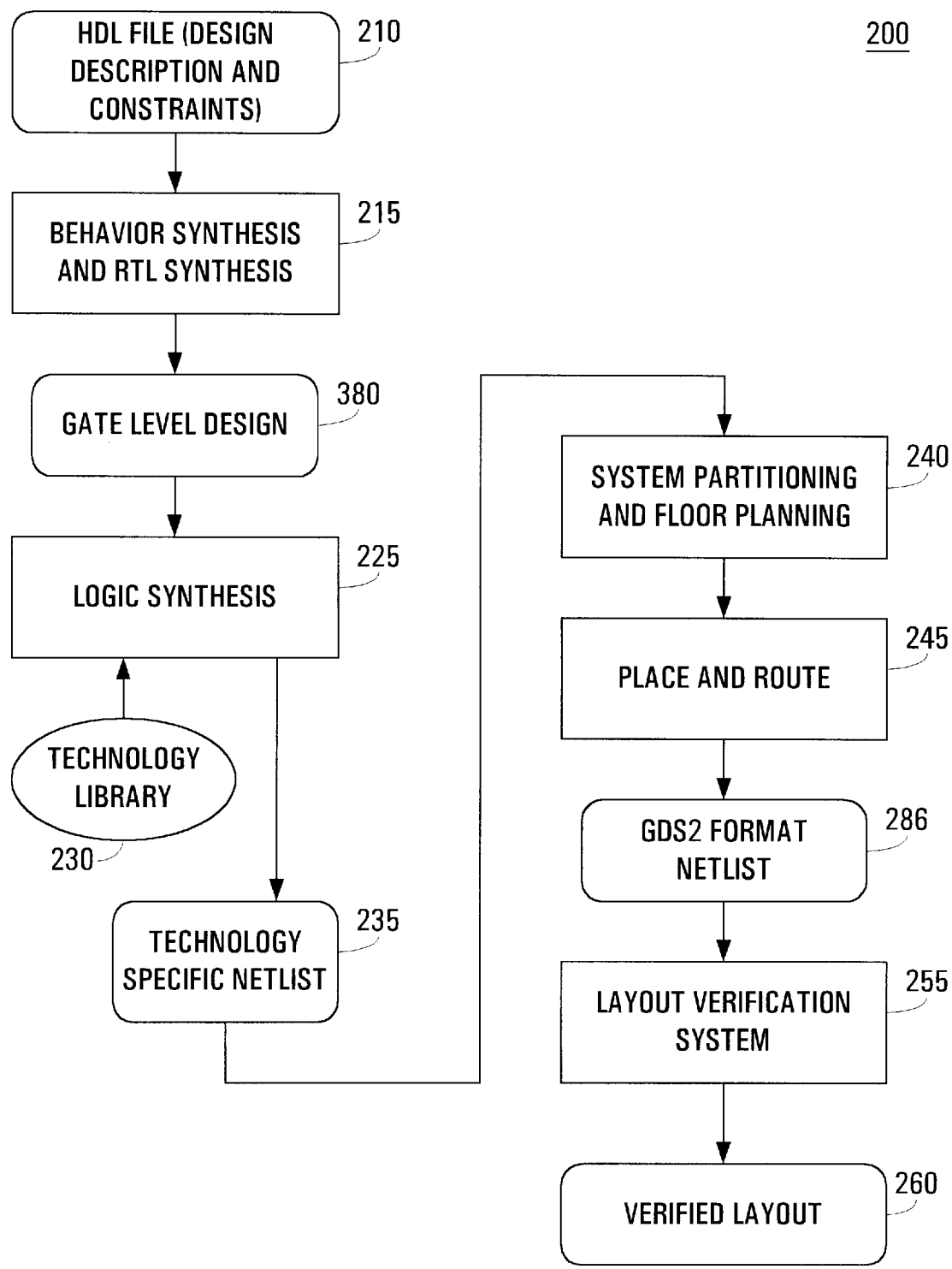
FIG. 3A is a flow chart illustrating electronic design automation (EDA) steps for an application specific integrated circuit (ASIC) design.
Figure 3B:
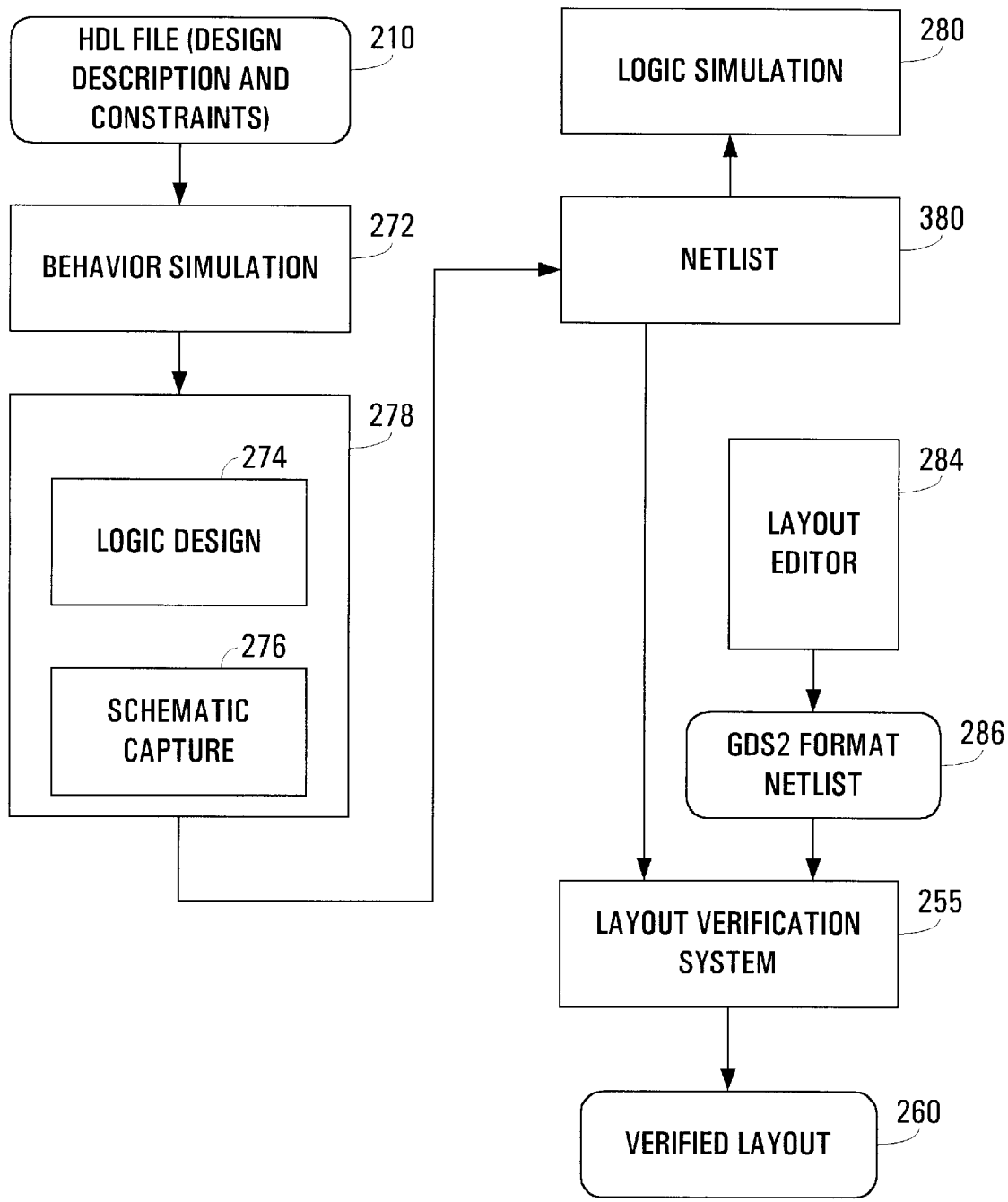
FIG. 3B is a flow chart illustrating EDA steps for a fully custom implementation of an integrated circuit design.

The following descriptions of FIG. 3A and FIG. 3B are provided to illustrate the context of the overall EDA framework in which the layout verification system 255 of the present invention resides. FIG. 3A illustrates a general electronic design automatic (EDA) flow diagram 200 of steps performed by computer system 112 in the design of an application specific integrated circuit (ASIC) from the HDL level to layout verification 255. FIG. 3B illustrates a similar flow diagram but for a fully custom IC design. Either of these processes, 200, 270, can be used to generate a netlist of the GDSII format of which the layout verification system 255 of the present invention can efficiently verify. As such, one embodiment of the present invention involves an efficient layout verification system 255.

With reference to FIG. 3A, an ASIC design flow 200 is illustrated. In process 200, an IC design is described in a high level design language (HDL) at 210. This HDL design 210 can include both behavioral descriptions and structural descriptions. At 215, circuit synthesis processes, e.g., behavioral and RTL synthesis, are applied to the HDL description 210 to yield a generic or "gate level" netlist design 380 (also called logical netlist) that contains definitions of generic cell logic functions and connectivity between them. The gate level netlist 380 can be broken into a hierarchical tree having different levels of subcell designs. Logic synthesis procedures 225, using technology specific libraries 230, convert the gate level netlist 380 into a technology specific netlist 235 that can also contain different levels of subcell designs.

System partitioning and floor planning procedures 240 are used to optimally place the subcell designs spatially within the substrate. Place and route procedures 245 are then used to optimally place individual cells and route the conductors that are used to connect the ports of the cells together. The result is a hierarchical netlist 286 that contains specific geometries of the transistors that are to be fabricated in the substrate and their connections. This netlist 286 can be stored and transferred using the well known GDSII data format as described above. The hierarchical structure and inter-relationships of the subcell designs of file 250 are represented with reference to exemplary structure 150 of FIG. 2B.

Typically the netlist 286 is stored as a number of inter-related files within subdirectories of a computer disk unit 104. The GDSII file 286 is fed to a layout verification system 255 that checks for: 1) design rule violations using a design rule checker (DRC); and 2) layout versus schematic (LVS) errors. The LVS check identifies errors where the layout represented in file 286 does not represent the logic design as indicated in HDL 210 or netlist 380. The result is a verified layout 260 or an error report indicating trouble spots.

With reference to FIG. 3B, the fully custom flow diagram 270 is illustrated. In flow 270, the HDL file 210 is processed by a behavioral simulation process 272 which is used to verify the described behavior of the IC design. After the behavior is verified, schematic capture 276 is used to manually implement the logic design 274. After the schematic capture 276, a technology specific netlist 380 (logical netlist) is completed and logic simulation 280 can be performed on netlist 380 for logic verification. A layout editor 284 can be used for manual layout implementation and the result is a GDSII file format 286 which is supplied to the layout verification process 255 of the present invention. Layout verification system 255 is described in more detail below. Layout verification system 255 of the present invention checks for: 1) design rule violations using a design rule checker (DRC); and 2) layout versus schematic (LVS) errors and the result is a verified layout 260 or an error report.

Therefore, the GDSII file 286 can originate from an ASIC style design (FIG. 3A) or from a fully custom style design (FIG. 3B). On subsequent layout verification of a netlist, the layout verification procedures 255 of the present invention advantageously reuse any unchanged subcell design that was previously verified. In effect, the layout verification procedures 255 of the present invention automatically identify unchanged subcell designs that have already been layout verified and bypass these subcell designs to avoid otherwise redundant DRC and LVS checking.

Layout Verification with Reusable Subdesigns

Figure 4A:
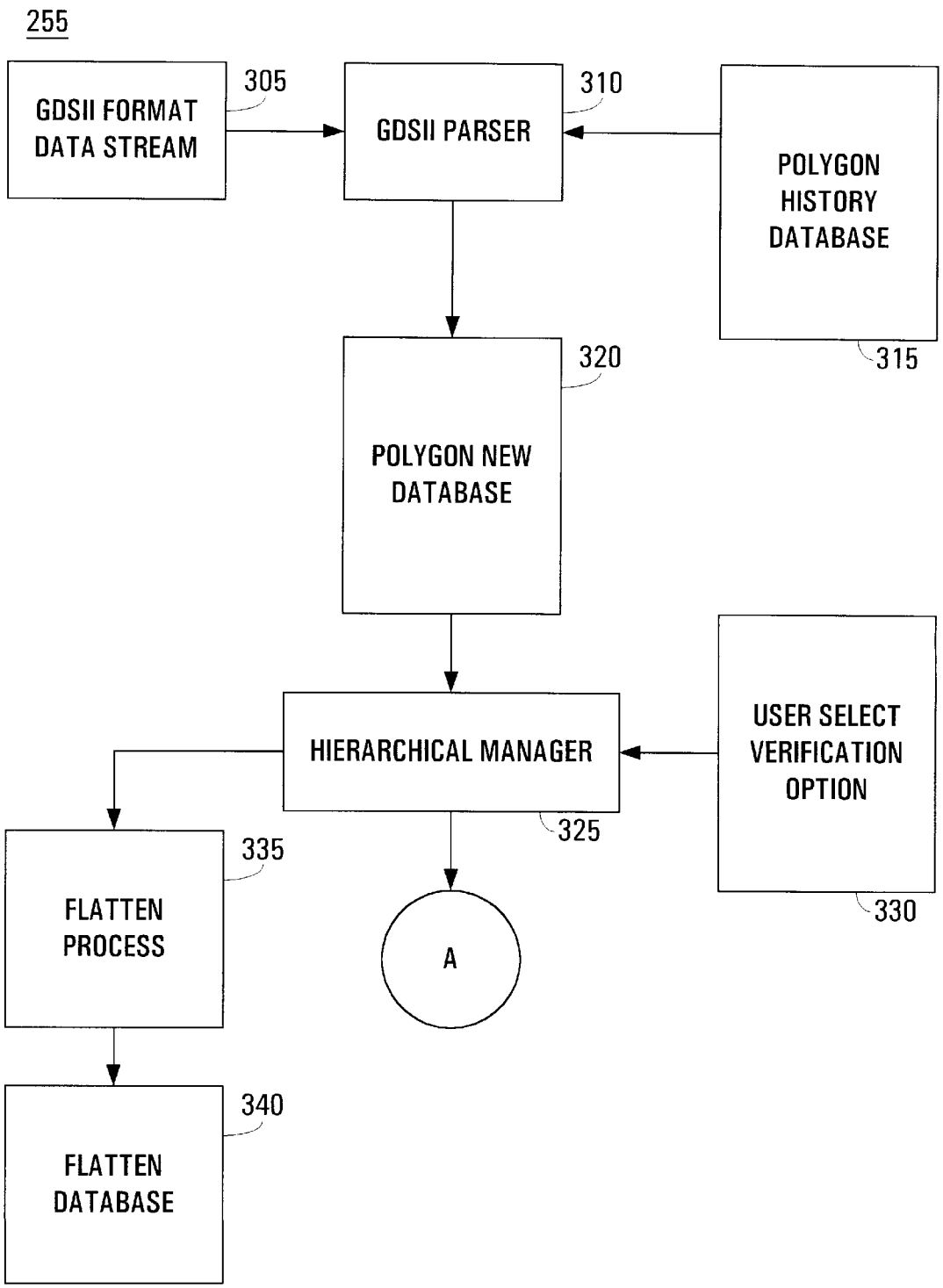
FIG. 4A and FIG. 4B represent a data flow diagram of the layout verification system of the present invention that uses reusable subcell designs.
Figure 4B:
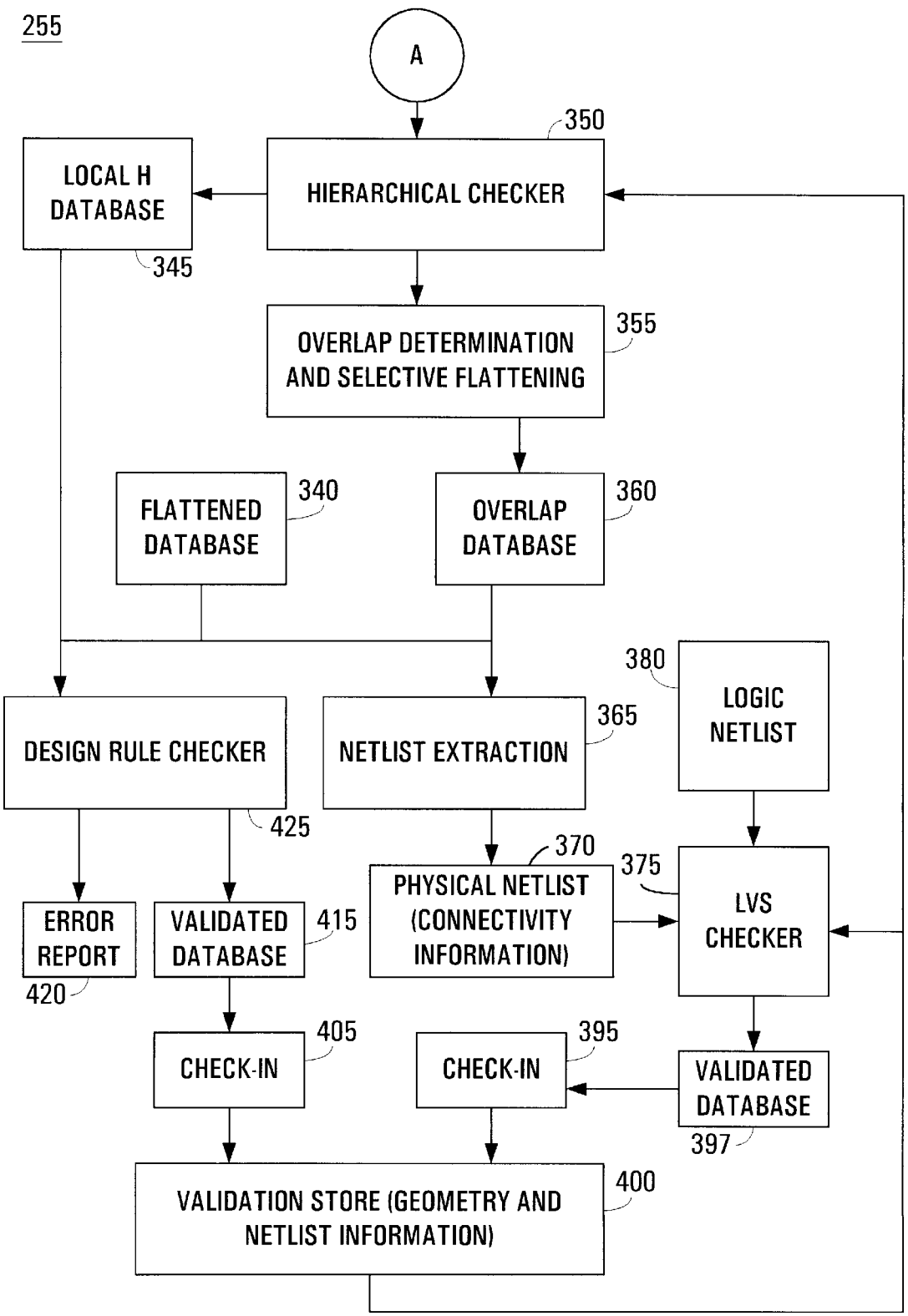

FIG. 4A and FIG. 4B represent a data flow diagram of the computer implemented elements of the layout verification system 255 of the present invention. The layout verification system 255 of the present invention consists of the data flow diagram of FIG. 4A and FIG. 4B as used in the manner described within process flow diagram 410 (FIG. 5A), process flow diagram 450 (FIG. 5B), process flow diagram 500 (FIG. 6A and FIG. 6B), process flow diagram 600 (FIG. 7), and process flow diagram 660 (FIG. 8A and FIG. 8B). The elements of the data flow diagram 255 are described with reference to above process flow diagrams.

Layout Verification Pre-processing

Figure 5A:
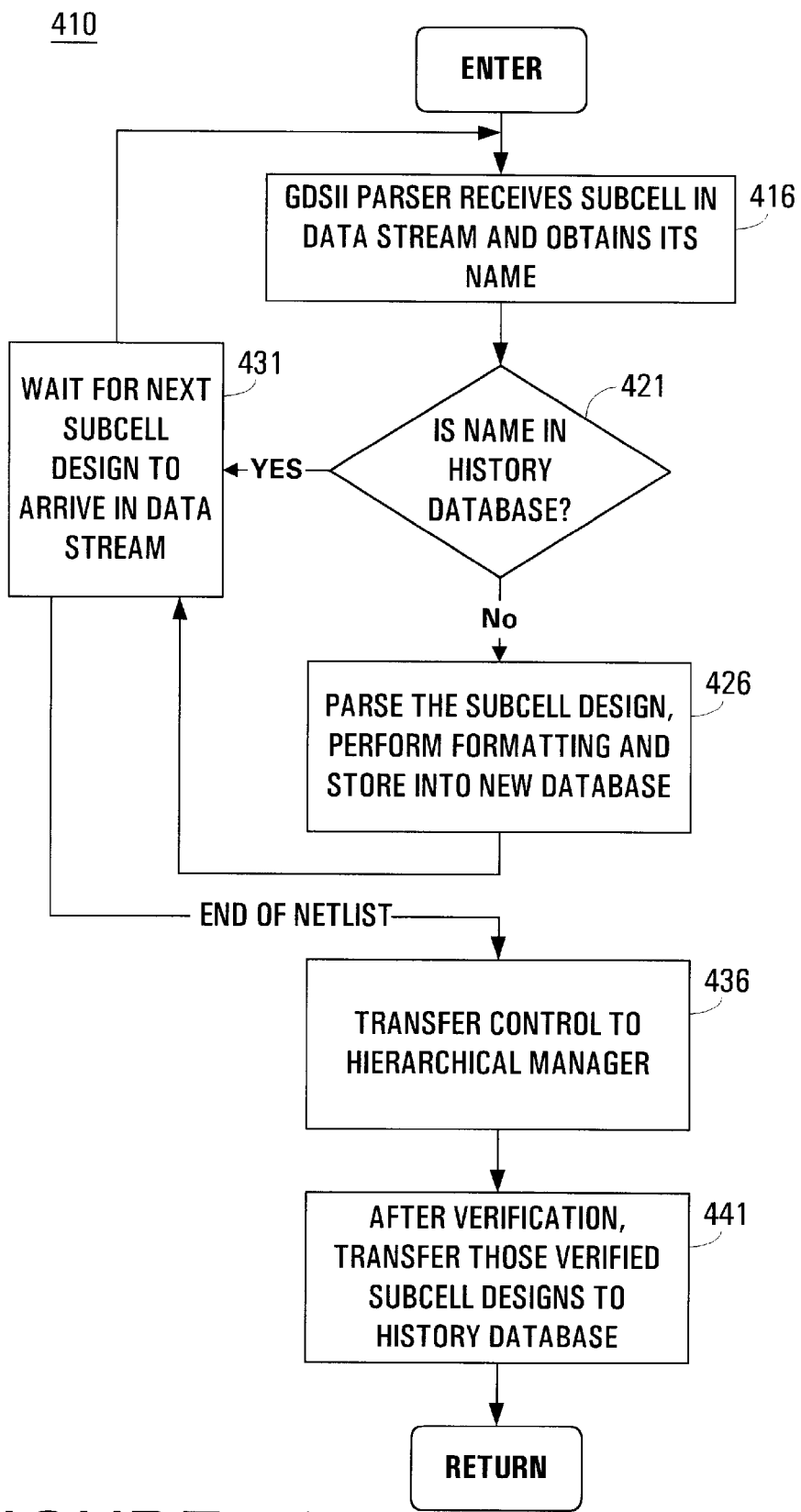
FIG. 5A illustrates steps performed by the GDSII parser of the present invention for efficiently preprocessing information for layout verification.

The layout verification system 255 of the present invention commences with preprocessing of the GDSII data which is now described with reference to FIG. 4A and FIG. 5A. At FIG. 4A, layout information representing an IC design that is ready for layout verification is received at block 305. This information is typically in GDSII format, originates from a netlist (e.g., netlist 286), and is received as a stream of subcell data containing an indication of the currently received subcell name (e.g., filename) and its contents, including other child subcell designs. Block 310 is a GDSII parser (parser 310) which examines the stream information from 305 and performs formatting as well as identifies the subcell name associated with the currently received subcell data. The subcell name is used to check whether or not the currently received subcell data is new (e.g., unrecognized by the parser 310) or old (e.g., recognized by the parse 310 as being already verified by the layout verification system 255 in a prior verification of this netlist).

A polygon new database 320 (new database 320) is a block of computer readable memory (e.g., RAM 102 or disk 104) that receives information from parser 310. The new database 320 is used to store only that information that corresponds to a new, e.g., unrecognized, subcell design which is one that does not correspond to a subcell design name that was previously verified by system 255. A polygon history database 315 (history database 315) is also a block of computer readable memory, analogous to the new database 320, that the present invention uses to store subcell names for IC designs that are recognized by parser 310 because they have previously been verified by system 255.

It is appreciated that only those incoming subcell designs from block 305 having names that are not located in the polygon history database 315 are processed by the parser 310 and then stored in the polygon new database 320. FIG. 5A illustrates the steps of pre-processing process 410 performed by the parser 310 to pre-process only layout data associated with new subcell design names. At step 416, the parser 310 receives a subcell design name and its associated information from block 305. At step 421, the parser 310 first compares each incoming subcell design name with those names stored in the history database 315. A name consists of a file name and an indication of its date of creation. If a name matches, then at step 431 parser 310 ignores the matching subcell design information and waits for the next subcell design to arrive. At step 426, only those subcell designs that do not match with any name in the history database 315 are processed by the parser 310, formatted, and stored in the new polygon database 320.

When a netlist is fully parsed, control is transferred at step 436 to the hierarchical manager 325 (FIG. 4A). It is appreciated that after a successful validation process, at step 441, those subcell designs stored in the polygon new database 320 are copied over, by the present invention, to the history database 315. By so doing, the present invention enables parse 310 to recognize these subcells as being already verified with reference to a subsequent layout verification.

The present invention advantageously avoids re-parsing a subcell design that has already been parsed in a previously layout verification procedure. The result is that only newly presented subcell designs (e.g., that have not been previously layout verified) are pre-processed on subsequent runs of the layout verification procedures of the present invention. By performing steps 410 of FIG. 5A, the present invention advantageously decreases overall layout verification processing time by reducing the pre-processing time required to parse a netlist on subsequent verification checks performed on that same or slightly modified netlist.

For example, assume a netlist, called A, includes subcell designs A, B, C, and D and is first run through parser 310. After verification, names A, B, C and D are stored in the polygon history database 315 if they validate. Assume next that the netlist A is modified and is now called A' and includes B, C, D and E subcell designs. Subcell E is new. Since B, C and D subcell designs are present in the history database 315 already, upon A' entering the parser 310, the data for subcell designs B, C and D are ignored and subcell design A' and E are stored in the new database 320. Of course, subcell design A', as stored in the new database 320, consists of any local structure and then references (e.g., calls) to B, C, D and E. In order to locate the actual geometry and connectivity data that constitutes netlist A', system 255 obtains the data in the following locations: (1) data for subcell designs B, C and D originate from history library 315; and (2) data for E and local data for A' originate from the new database 320.

Hierarchical Tree Construction

The streams of data that arrive at the parser 310 of FIG. 4A contain parent-child relationships for each subcell design, but the entire tree structure (e.g., see FIG. 2B) for the netlist is not known by the parser 310 as it receives the netlist data. Therefore, the hierarchical manager process 325 is responsible for accessing the data within the new database 320 and the history database 315 in order to generate the hierarchical tree information as shown in FIG. 2B for the exemplary netlist 150. The hierarchical manager 325 is aware of all subcell design relationships from the root directory to each leaf cell. This hierarchical tree information is constructed by the hierarchical manager 325 using well known techniques based on the parent child relationships between subdesigns that are incorporated by other subdesigns, etc. The hierarchical tree information that is constructed by the hierarchical manager 325 contains all parent child relationships from the root directory (e.g., root 152 of FIG. 2B) down each branch of the structure 150 to all leaf cells at the bottom of the structure 150. It is appreciated that the hierarchical manager 325 also contains information regarding which database (e.g., new database 320 or old database 315) the subcell designs are found within and the storage pathways (e.g., within disk 104) that are needed to locate the data in computer memory. It is appreciated that the hierarchical manager 325 utilizes the alphanumeric portion of the file name and does not require the time of creation or the time of modification that are also parts of the file name.

The hierarchical manager 325 constructs all subcell design relationships from the root directory to each leaf cell based on the parent child relationships that are presented by the GDSII data stream. For instance, in the input GDSII data stream, the following parent child relationships might exist between exemplary cells: A–>B; A–>C; A–>D; and D–>E. The hierarchical manager 325 directly stores, within its data structure, information indicatin that parent cell A calls cells B, C and D and that cell D calls cell E. This collection of information is distributed within the GDSII data stream and therefore not readily available. The hierarchical manager 325 collects and stores this hierarchical information as a collection of pointers into a directly accessible data structure.

After the pre-processing steps 410 are complete, the layout verification system 255 performs verification on the netlist data. The layout verification system 255 of the present invention contains four different modes of operation that can be user selected from user select verification option block 330 (block 330) of FIG. 4A. These different modes are as follows: flatten; hierarchical; composite; and leaf cell. Flatten mode removes the hierarchical nature of a subcell design and all geometry and connectivity are pushed into a single file that references no other file. Hierarchical mode maintains the hierarchical nature of the data and processes subcell designs separately according to their hierarchical order. Composite only perform layout verification on subcell overlap areas while leaf cell only performs layout verification on the leaf cells of the hierarchical tree. These layout verification modes are described in operation below.

Layout Verification in Flatten Mode

In flatten mode, the entire received netlist for an IC design is flattened into the top directory by the flatten process 335 of FIG. 4A and stored into the flatten database 340. This mode of operation is described with reference to the process 450 of FIG. 5B and also the data flow diagrams of FIG. 4A and FIG. 4B. Although described with reference to a hierarchical tree, it is appreciated that process 450 can also be applied to any subdesign cell having child subdesigns.

Figure 5B:
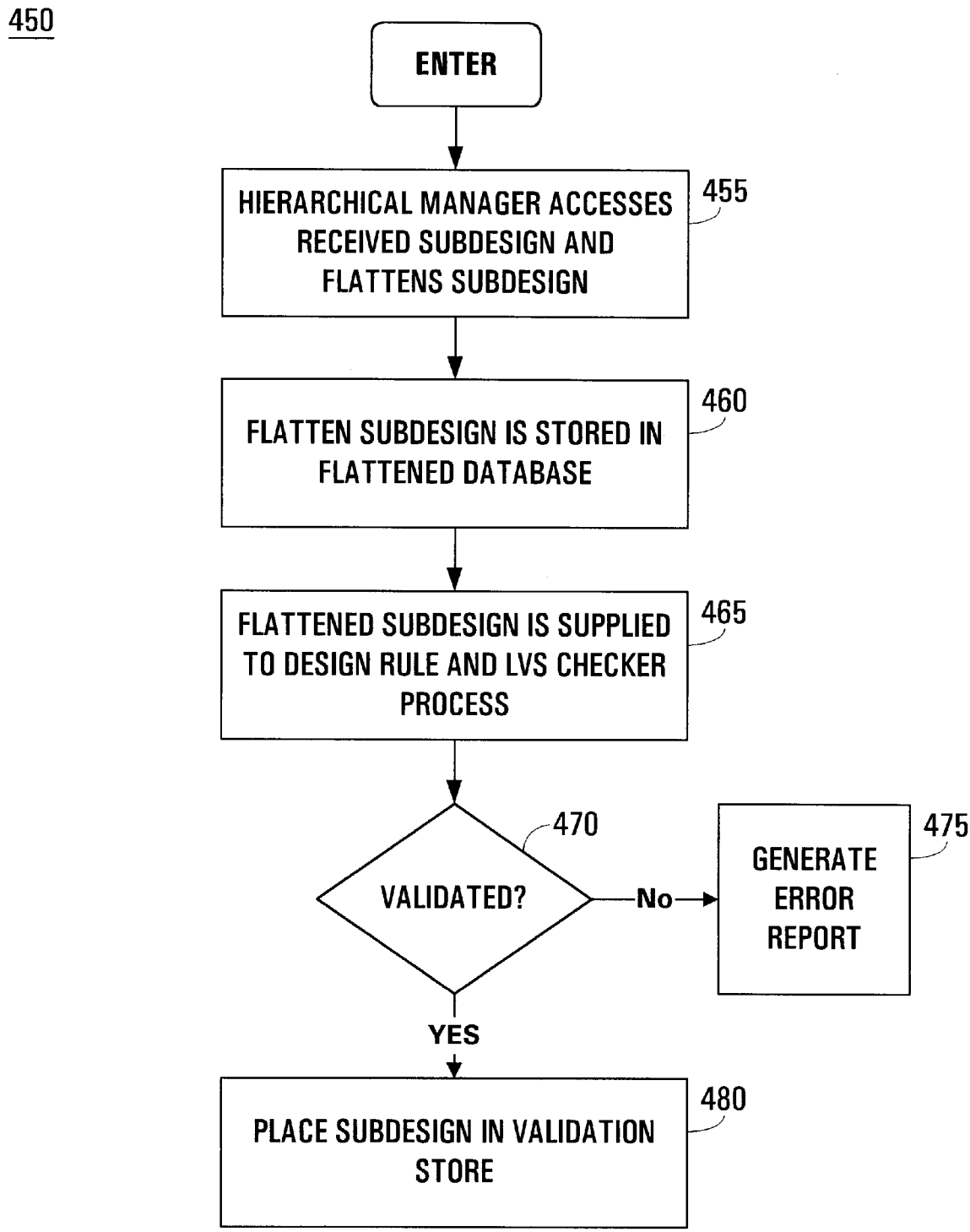
FIG. 5B is a flow diagram of steps performed by the layout verification process of the present invention for the flatten user mode selection.

At step 455 of FIG. 5B, if the flatten mode is selected by the user then the hierarchical manager 325 (FIG. 4A), using the flatten process 335 (FIG. 4A), accesses the root directory of the netlist and flattens the subdesign completely. Any of a number of well known flattening processes can be used for flatten process 335. Essentially at step 455, all geometry and connectivity of the leaf cells and all local elements of all subdesigns are pushed up into the file of the main or root directory. At this stage, the netlist loses its hierarchical nature and the data is therefore represented and accessed in a single directory 340 (FIG. 4A) and is considered "flat."

As shown by FIG. 5B and FIG. 4B, this flattened database 340, at step 465 is then supplied to a design rule checker 425 and the layout versus schematic (LVS) checker 375. Portions of the design rule checker 425 of the present invention can be implemented using a number of well known processes, one of which is described further below. At step 470 of FIG. 5B, if the design is validated then the subdesign can optionally be stored in the validation store 400 (FIG. 4B) at step 480. Otherwise, at step 475 of FIG. 5B, an error report is generated to indicate those layout areas that the design rule checker 425 and/or the LVS checker 375 indicated as error prone. Any subcell design having an error is not allowed to be included into the validation store 400.

It is appreciated that the steps 450 of FIG. 5B can also be performed on any subcell design of a netlist where the netlist is otherwise processed in hierarchical mode. For example, assume a netlist, called P, contains subcell designs A, B, C, and D and subcell design C contains leaf cells C1–C3 (FIG. 2B). The user can flatten subcell design C using steps 450 while performing layout verification of the entire netlist design P in an otherwise hierarchical fashion. In effect, by flattening subcell design C, it becomes treated as a leaf cell by the hierarchical manager 325 (FIG. 4A). Hierarchical layout verification processes of the present invention are described below.

Layout Verification in Hierarchical Mode

Figure 6A:
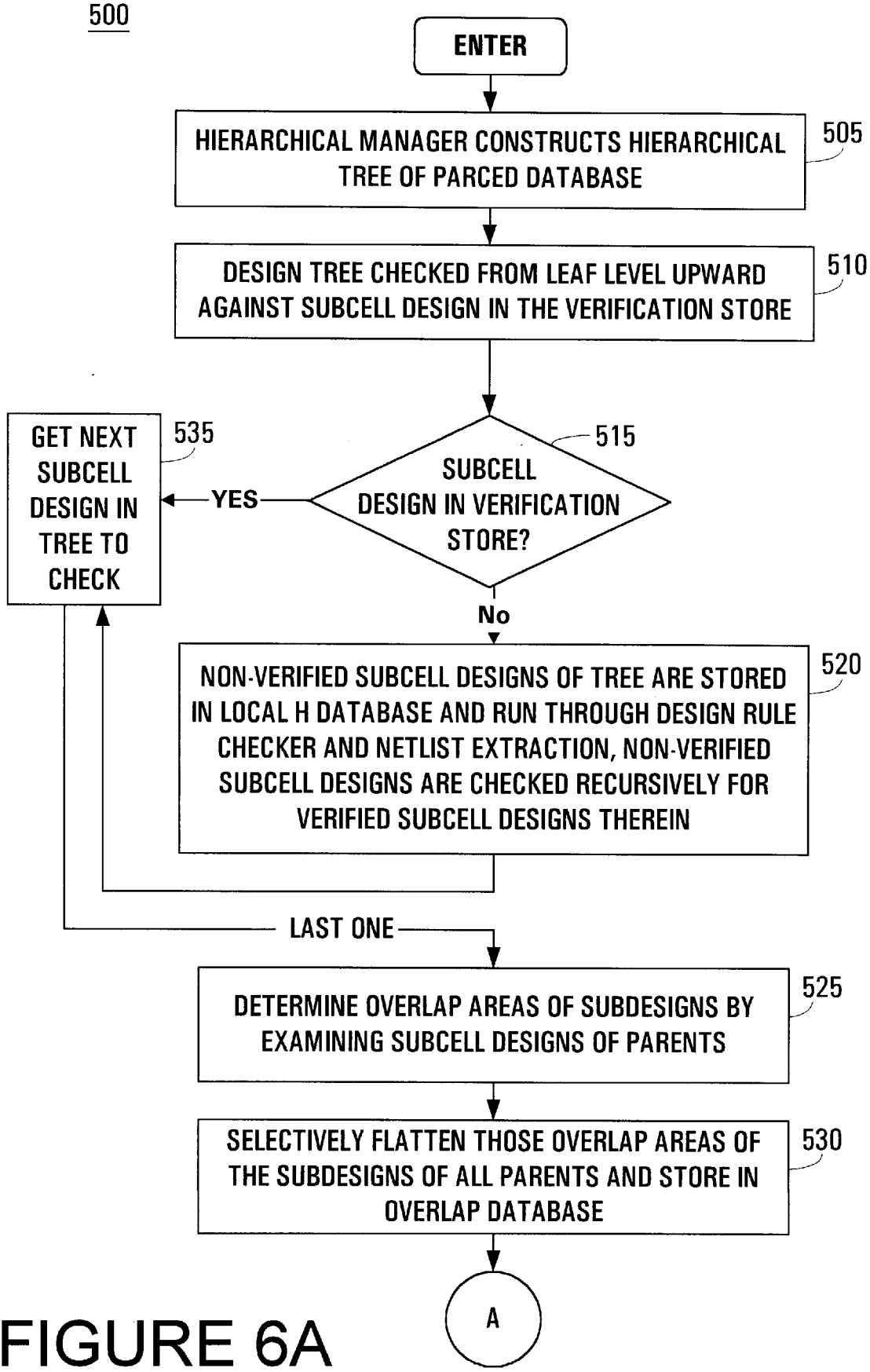
FIG. 6A and FIG. 6B represent a flow diagram of steps performed by the layout verification system of the present invention for hierarchical user mode selection and design rule checking (DRC) verification.
Figure 6B:
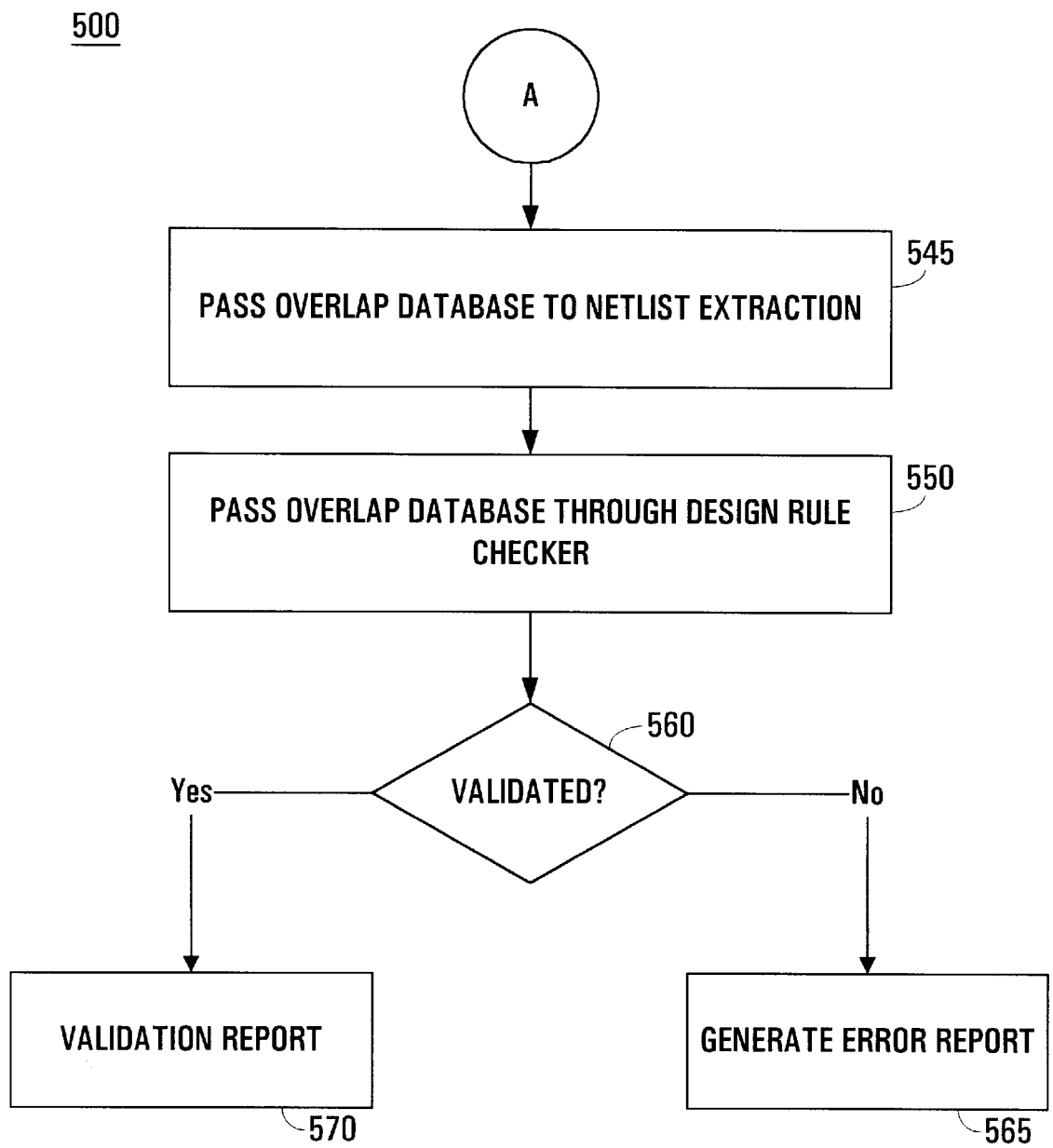

After the pre-processing or parsing process 410 of the present invention, if the user selects the hierarchical layout verification mode, then process 500 of FIG. 6A and FIG. 6B is performed by the present invention. A general description of process 500 is first presented. The hierarchical layout verification process 500 of the present invention advantageously avoids performing design rule checking (DRC) and layout versus schematic (LVS) checking on any subcell designs that were previously verified, validated and remain unchanged. In effect, the results of these subcell designs are "resused" during the layout verification process. This substantially decreases the time required to perform subsequent layout verification on the same or modified netlist design.

Further, in order to account for changes in the interfaces between old subdesigns and new subdesigns, process 500 performs the related tasks of (1) identifying overlap areas between new subdesigns and old subdesigns and (2) selectively flattening these overlap areas. The flattened overlap data is then passed through DRC and LVS checking as described further below. Further, connectivity information is determined between the input/output ports of the new subcell designs and the remainder of the netlist. This connectivity information is then passed through LVS checking. By reusing validated subcell designs in the netlist layout verification process, the present invention substantially decreases the overall time required to perform subsequent layout verification.

Figure 9:
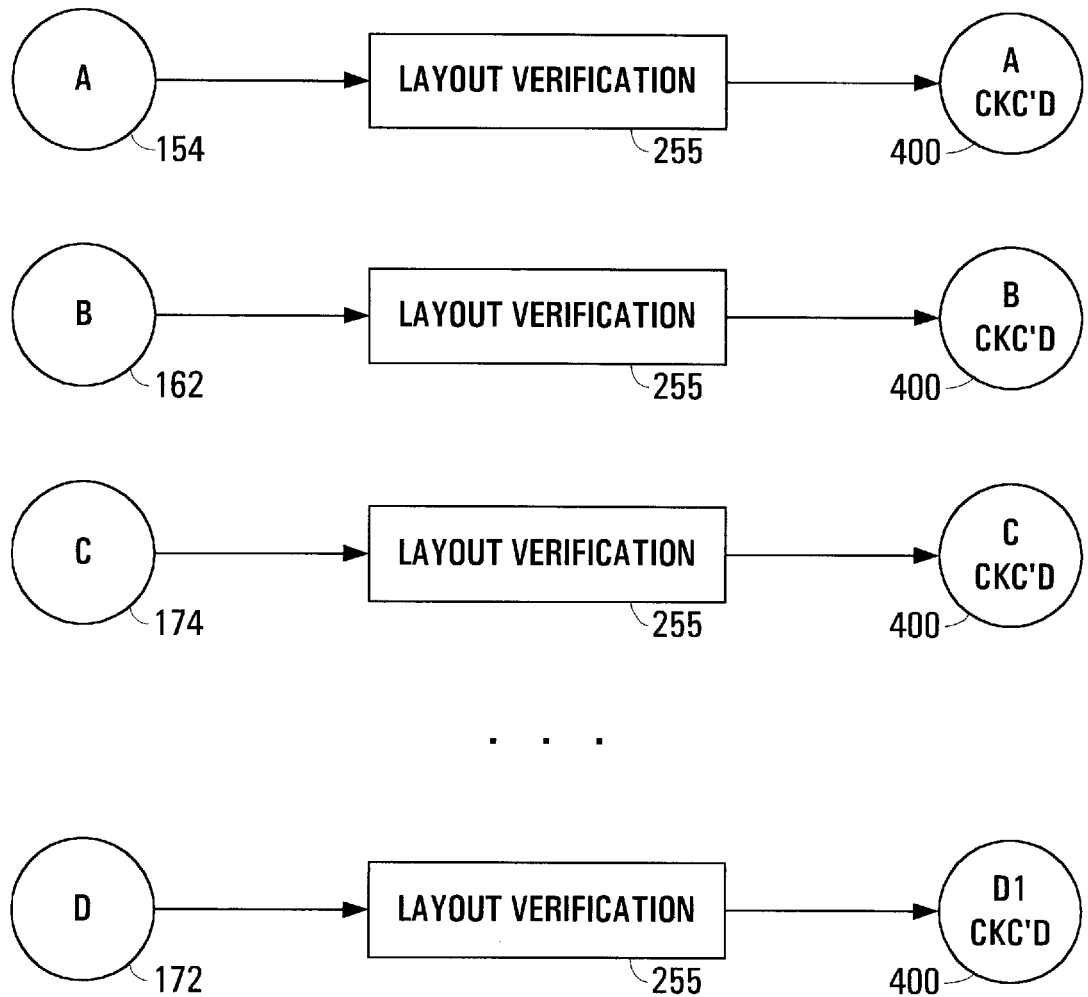
FIG. 9 is a logical illustration of separate subcell designs of an integrated circuit design passed through a layout verification process in accordance with one embodiment of the present invention.
Figure 10:
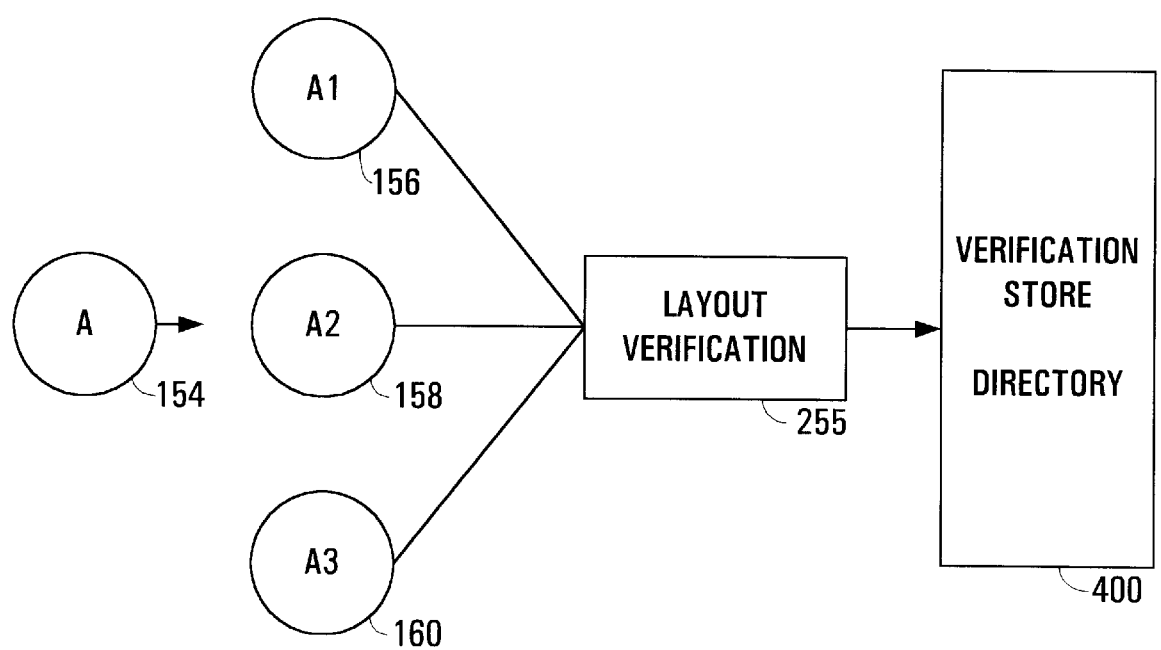
FIG. 10 is a logical illustration of a cell design, having multiple subcell designs therein, being passed through a layout verification process in accordance with one embodiment of the present invention.

An example is now presented. FIG. 9 represents the hierarchical tree 150 of FIG. 2B passing through layout verification 255 of the present invention branch by branch in hierarchical mode. Branch A 154 is processed first, branch B 162 is processed second, branch C 174 is process third and lastly leaf cell D1 is processed last. The result is that all of the geometry and connectivity information for this netlist that validates normally is then stored in the validation store 400. Assume that leaf cells A1 to A3 are then modified but the remainder of the netlist is the same. Upon a subsequent hierarchical layout verification of the netlist, each branch B, C and D1 are not re-processed because they exist unchanged within the validation store 400. However, as shown by FIG. 10, the leaf cells A1, A2 and A3 are run again through layout verification 255. In this instance, the second layout verification process can be performed in much less processing time.

Reference is now made to the data flow diagram 255 of FIG. 4B in conjunction with the process flow diagram 500 of FIG. 6A and 6B for describing the hierarchical layout verification user mode in accordance with the present invention. At step 505, the hierarchical manager 325 (FIG. 4A)

reads both the new database 320 and the history database 315 and constructs a hierarchical tree of the parsed or pre-processed database information. A number of well known methods can be used by the hierarchical manager 325 to construct the hierarchical tree. The hierarchical manager 325 uses the hierarchical tree to walk the netlist subcells when performing hierarchical verification. The database information can exist within (1) the history database 315 and/or (2) the new database 320.

At step 510 of FIG. 6A, the hierarchical checker 350 uses the hierarchical tree constructed by the hierarchical manager 325 to select individual subcell designs as candidates for processing through the design rule checker 425. Pursuant to this selection process, each branch of the hierarchical tree is checked by the hierarchical checker 350 (FIG. 4B), branch by branch, from the leaf level upward. This process 500 is performed subcell design by subcell design until each branch of the hierarchical tree is processed from the branch bottom to the branch top. Once the currently selected subdesign name is selected by the hierarchical checker at step 510, it is checked by step 515 of the present invention against the subdesign cell names located within a validation store 400. It is appreciated that the time and date of creation of the subcell design are also part of the file name. In an alternative embodiment, the time and date of last modification is also a part of the file name.

Validation store 400 is a block of computer memory that contains the layout information for each subcell design that has been validated properly in accordance with the present invention. Specifically, validation store 400 contains geometry and connectivity information for each subcell design that was properly verified by the design rule checker 425 and the LVS checker 375. At step 515, if the currently selected subcell design matches with a name that is located within the validation store 400, then at step 535, the hierarchical checker 350 skips this subcell design, because it is already validated, and moves up the current branch of the hierarchical tree to obtain another subcell design. It is implicit that if a parent subcell design name matches with a name from the validation store 400 that all child subcells of that parent subcell are also validated. At step 535, the next subcell design is obtained and step 515 is entered again to check the next subcell design.

At step 515 of FIG. 6A, if the currently selected subcell design name is not located within the validation store 400 then it is considered new, e.g., unrecognized and step 520 is entered. However, even though a subcell design is considered new or unrecognized it may contain, inside, other child subdesign cells there that are not new at all but rather already verified and located within the validation store 400. Therefore, for each subdesign that step 515 identified as "new," at step 520 all of its child subdesigns, and their child subdesigns, etc., are nevertheless checked by the hierarchical checker 350, one by one, to determine if any are located within the validation store 400 or not. In so doing, in a recursive process, only those subdesigns of the input netlist that are determined not to be located within validation store 400 are copied into the local hierarchical database 345 at step 520. These are the identified "new" subcell designs.

It is appreciated that, in accordance with step 520, each subdesign placed into the local hierarchical database 345 is passed through the design rule checker 425 and netlist extraction 365. Netlist extraction 365 identifies the connectivity information of the subcell design including the input/output pin connectivity of the subdesign's children. Extracted netlist information, including connectivity information, for each subcell design of the local hierarchical database 345 is then stored in the physical netlist database 370.

An example of steps 510–535 is given below with reference to the exemplary hierarchical tree structure 150 of FIG. 2B. Assume subcell designs C1 176 and C2 178 are stored within the validation store 400 as a result of a prior successful validation, but subcell design C3 is either modified or added since the last layout verification and therefore is not stored within the validation store 400. If subcell C were the currently selected subcell design at step 515, then it would be flagged as new or unrecognized because when subcell design C3 180 was added, its parent, subcell design C 174, would also have been updated. At step 520, all subcells of C 174 are analyzed to determine which are stored in the validation store 400. This results in step 520 determining that C1 176 and C2 178 are stored in the validation store 400. Therefore, the only subcell designs that are stored in the local hierarchical database 345 of FIG. 4B, in this example, are subcell C3 180 and any local elements of subdesign C 174 if they were modified since the last layout verification of this netlist. It is appreciated that if the currently selected subcell design is a leaf cell, then no recursive analysis of this type is required.

With reference to FIG. 4B, each time a subcell design is passed into the local hierarchical database 345 the hierarchical checker 350 calls the design rule checker 425. When a subcell design is passed through the design rule checker 425 it is also passed through the netlist extraction block 365. The netlist extraction block 385 is a well known process that extracts connectivity information from the subcell design and any other subcell design located therein and this information is stored in the physical netlist 370. Therefore, refer the example above, assuming C1 176 and C2 178 are recognized and C3 180 is new. In this example, the netlist extraction block 365 would perform netlist extraction, including connectivity information, for C3 180 since it is unrecognized. In addition, since the parent, C 174, includes a new subcell design, the netlist extraction block 365 would generate connectivity information of all connections of all input/output ports of the child subdesigns C1 176, C2 178 and C3 180 with respect to each other and also with respect to the input/output ports of the parent C 174. All of this information is then stored in the physical netlist database 370 for the LVS checker 375.

The present invention performs the above processing so that the physical netlist 370 contains information regarding all possible connections that are made between the new subdesign, C3 180, and any other subdesign within the netlist. It is appreciated that the netlist extraction block 365 performs this processing on each subcell design of the local hierarchical database 345.

If the result of the design rule checker 425 indicates that a given subcell design is validated at block 415, then at block 405 a check-in process is executed where the geometry information of the validated subcell design is to be added to the validation store 400. This geometry information will be seen by the hierarchical checker 350 upon a subsequent validation process on the same netlist. If errors were detected in the subdesign by the design rule checker 425, then an error report 420 (also called violation report) is generated and the geometry of the subdesign is not added to the validation store 400. The above processing is performed on each subcell design of the local hierarchical database 345. Layout versus schematic (LVS) checking is described after overlap processing.

Overlap Processing in Hierarchical Verification

With reference to FIG. 6A, when the last subcell design of the current netlist has been processed by the hierarchical checker 350 at step 535 or step 520, step 525 is then entered. It is not enough to verify through the design rule checker 425 only those new or unrecognized subcell designs independently of the overall design. The present invention recognizes that layout areas where a new subcell design overlaps another design also need to be verified by the design rule checker 425. Often cells overlap within an IC design to reduce the length of connections between their ports, or to save substrate space, or overlap of two or more cells may be required to form the underlying transistor device itself.

With reference to FIG. 4B, the overlap determination and selective flattening block 355 begins processing to obtain this information. At step 525, the present invention examines parent subdesigns to determine those layout areas in which a new or unrecognized subdesign overlaps any other subdesign within the netlist layout. In one embodiment, if a new or unrecognized subdesign overlaps a subdesign that is located in the validation store 400, the overlap portion is identified by the present invention and selective flattening is performed to obtain the geometry within this overlap region. This geometry is then passed through layout verification. Overlap is determined by inspecting the spatial location of the bins of the parent subcell designs to determine where overlap areas exist between child subdesigns. This is performed across the entire layout and the parent subcell design for each new subcell design is checked to locate overlap conditions.

A description of the overlap determination processes of step 525 of FIG. 6A is found in the incorporated co-pending U.S. patent application Ser. No. 08/940,162, filed on Sep. 30, 1997 and entitled LAYOUT OVERLAP DETECTION WITH SELECTIVE FLATTENING IN COMPUTER IMPLEMENTED INTEGRATED CIRCUIT DESIGN, attorney docket SNSY-A1997-033, by Ho and Tang and assigneed to the assignee of the present invention. The areas of overlap of each subcell design are logged into a special overlap file maintained within block 355. Optionally, at step 525, each parent subdesign can be checked for any cell overlap whether or not the overlap involves a new or unrecognized cell. This can be performed in an alternative embodiment of the present invention.

Figure 15:
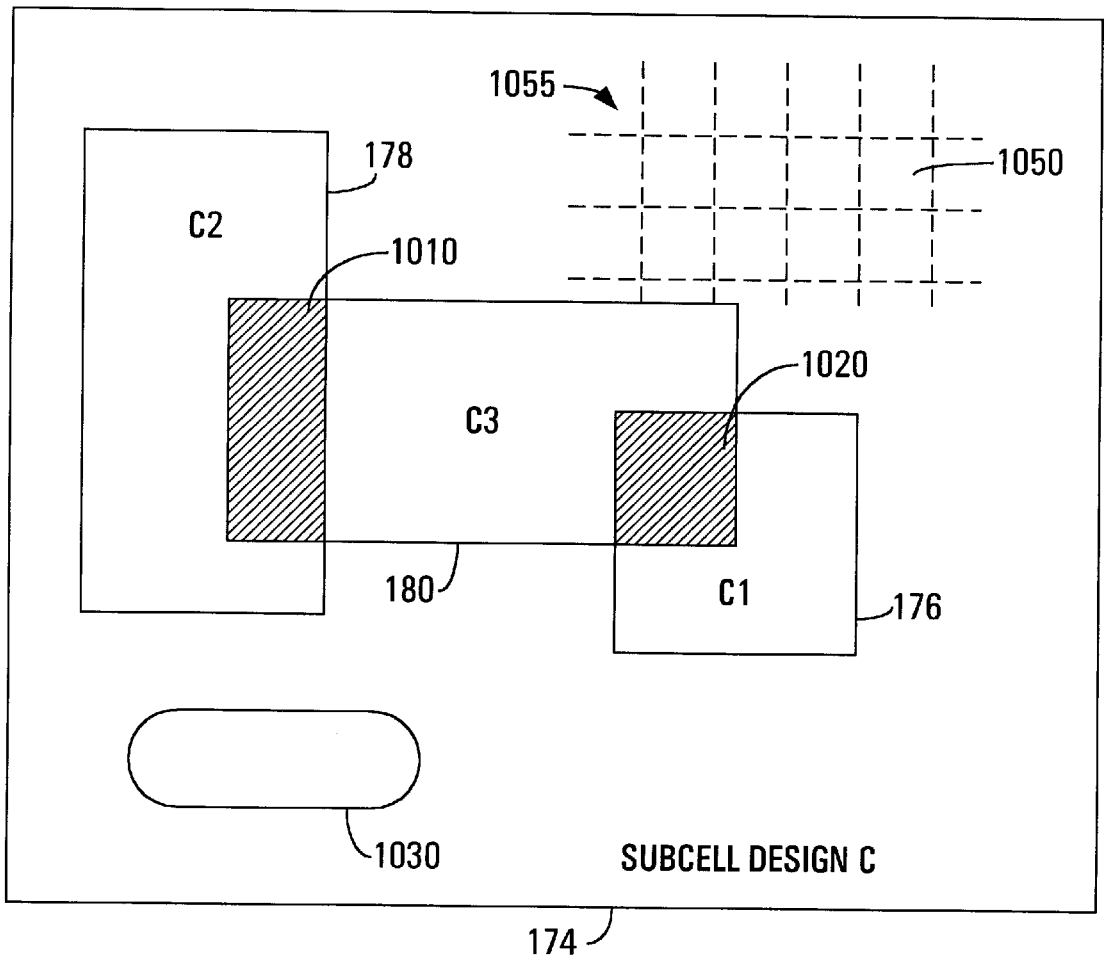
FIG. 15 illustrates overlap areas as determined by the present invention for an exemplary subcell design.

FIG. 15 illustrates the two dimensional spatial layouts of an example subcell design, C 174, to show the overlap processing of block 355 of the present invention. As shown, subcell design C 174 contains two child subcell designs C1 176 and C2 178 that overlap with a third, unrecognized, subcell design C3 180. For parent subcell design C 174, block 355 of the present invention, identifies overlap region 1010 between subcell designs C3 180 and C2 178 and also identified overlap area 1020 between subcell designs C3 180 and C1 176. Local structure 1030 is also shown. Subcell design C 174 is divided into a two dimensional array of bins 1050 of arbitrary size; a portion 1055 of this array is shown in FIG. 15. Overlap is determined by searching each respective bin of a parent subcell and recording the whether or not a child subdesign is within the respective bin. A bin 1050 of the parent is part of the overlap area if (1) it has more than one child subdesign found therein or (2) it has at least one child subdesign and local structure 1030 found therein.

Secondly, at step 530 of FIG. 6A, only those portions of the subcell designs that are overlapping, as determined at step 530, are then flattened by block 355. This is advantageous because by performing selective flattening only on these overlapping portions, the geometry data required for layout verification is reduced. A description of the selective flattening process of step 530 is found in the incorporated co-pending U.S. patent application Ser. No. 08/940,354, filed on Sep. 30, 1997 and entitled SELECTIVE FLATTENING IN LAYOUT AREAS IN COMPUTER IMPLEMENTED INTEGRATED CIRCUIT DESIGN, attorney docket SNSY-A1997-032, by Ho and Tang and assigneed to the assignee of the present invention. Once the geometry data corresponding to the identified overlap regions has been flattened, it is represented in the overlap database 360 of FIG. 4B.

At step 545 of FIG. 6B, the geometry data represented by the overlap database 360 is then passed through the netlist extraction block 365. At block 365, the present invention obtains the physical netlist of the overlap areas including all connectivity information; this determined information is then placed into the physical netlist 370 for the LVS checker 375. For instance, if subcell C3 overlaps subcell C2 and C1 (FIG. 15) at portions 1010 and 1020, then the netlist extraction block 365 determines the connectivity information of portions 1010 and 1020 with reference to subcells C1, C2 and C3. This information is then stored in the physical netlist 370.

At step 550 of FIG. 6B, the overlapping geometries of the overlap database 360 are then passed through the design rule checker 425. At step 560, if the overlap areas have errors in their geometries, then an error report at 420 is generated by step 565. Otherwise a validation report is generated at step 570.

Layout Versus Schematic Checker

Figure 7:
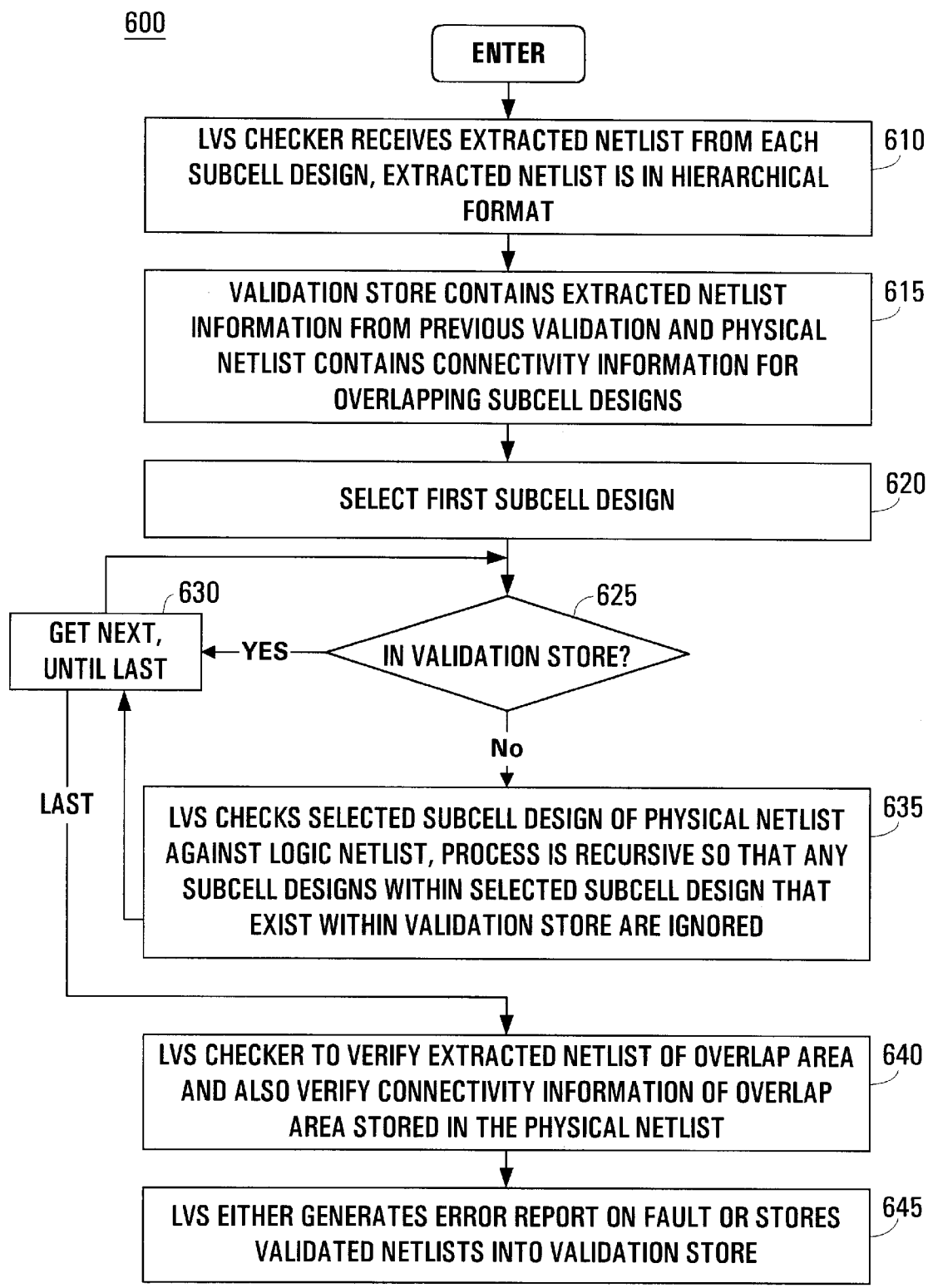
FIG. 7 represents a flow diagram of steps performed by the layout verification system of the present invention for hierarchical user mode selection and layout versus schematic (LVS) verification.
Figure 8A:
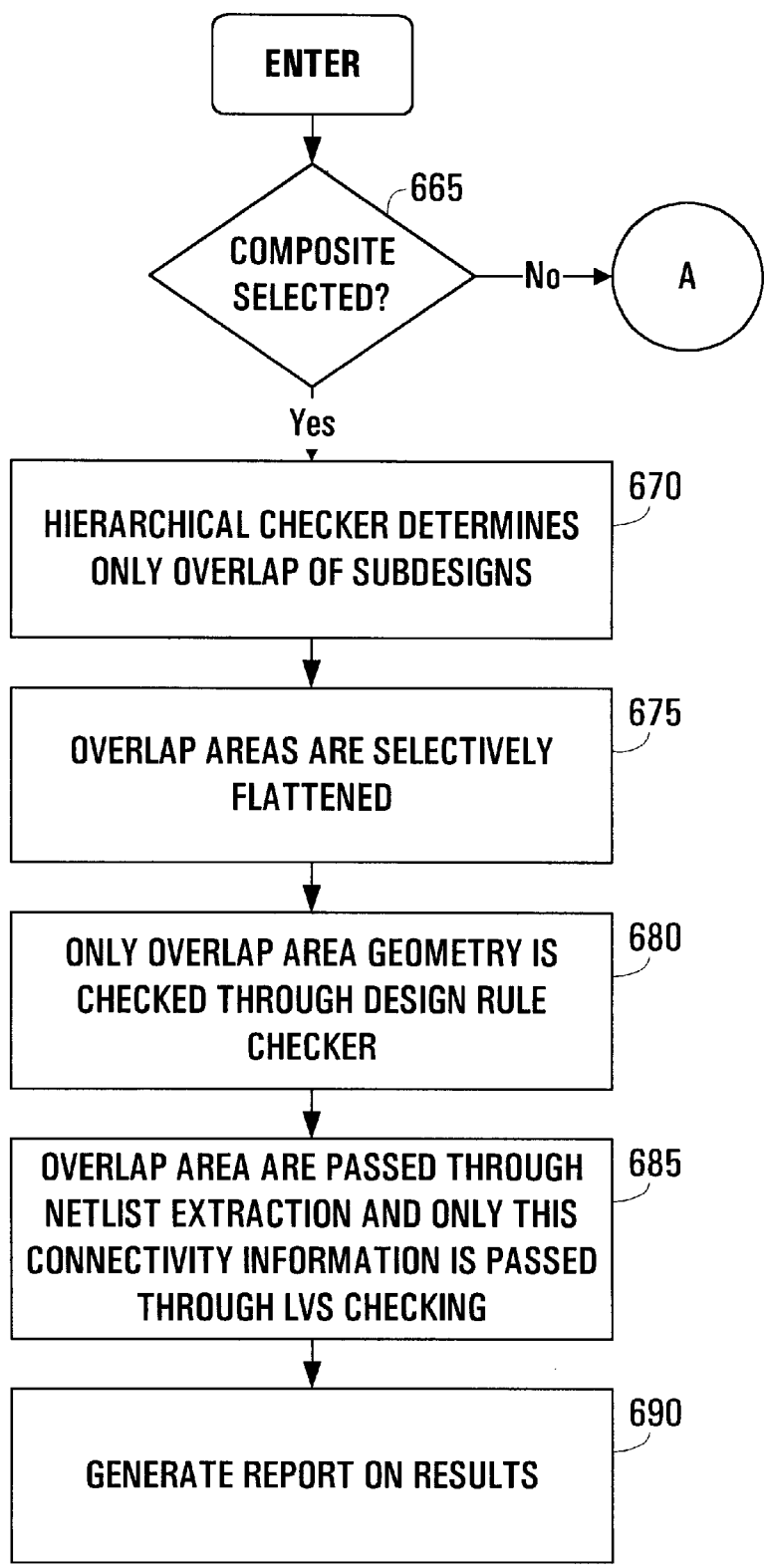
FIG. 8A is a flow diagram of steps performed by the layout verification system of the present invention for composite user mode selection with both design rule checking (DRC) verification and layout versus schematic (LVS) verification.
Figure 8B:
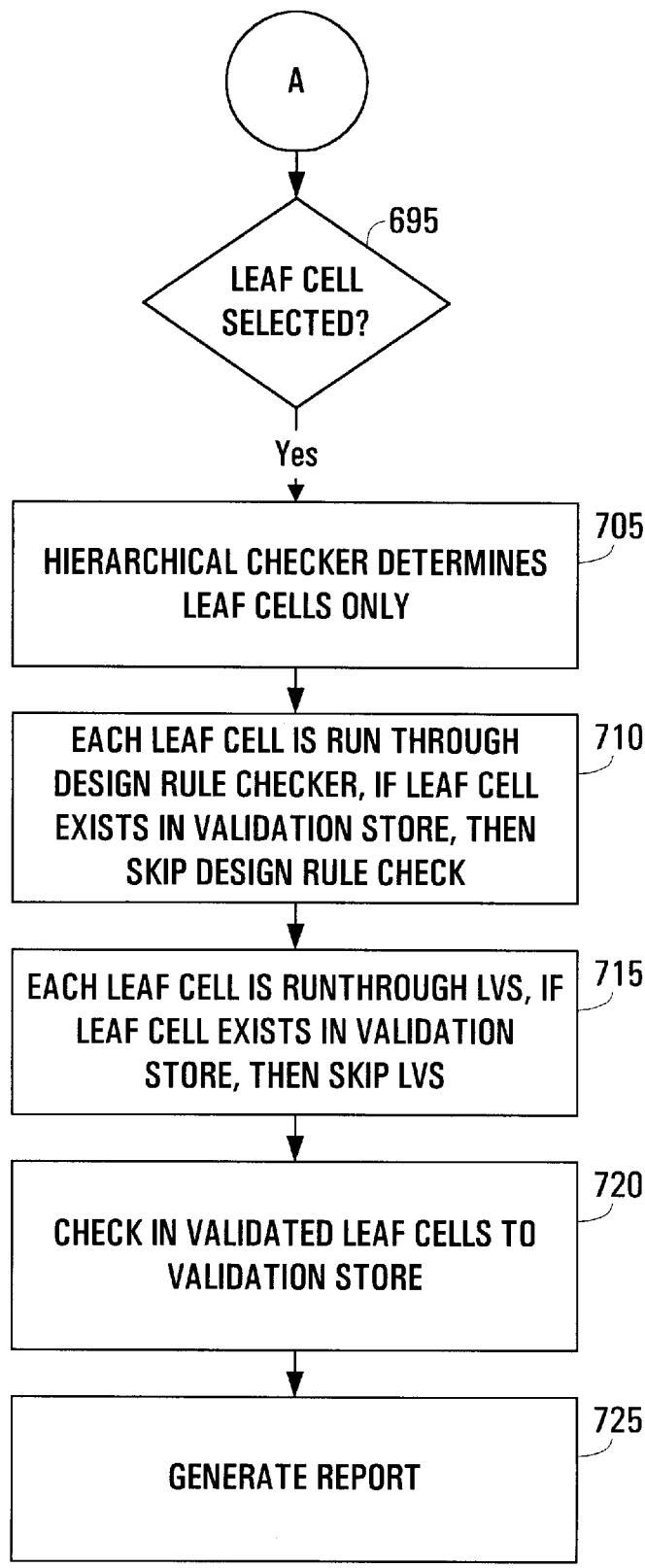
FIG. 8B is a flow diagram of steps performed by the layout verification system of the present invention for "leaf cell" user mode selection with both design rule checking (DRC) verification and layout versus schematic (LVS) verification.

Refer to FIG. 7 which illustrates the process 600 performed by the present invention for layout versus schematic (LVS) checking. In LVS checking, the physical netlist is checked against the logical netlist so that the layout information is consistent with the netlist logic. The present invention LVS checker 375, like the hierarchical checker 425, has access to the validation store 400. Those subcell netlist designs that exist within the validation store 400 are ignored by the LVS checker 375 in much the same way that subcell geometry designs are ignored by the design rule checker 425. As described in more detail below, the physical netlist 370 checked by the LVS checker 370 consists of: (1) the physical netlist portions corresponding to the subcell designs within the local hierarchical database 345; (2) those layout portions corresponding to the overlap database 360; and (3) the connectivity data regarding the connections of new or unrecognized subcell designs to other subcell design of the netlist.

Refer to FIG. 7, FIG. 4A and FIG. 4B. At step 610 the LVS checker 375 can access the extracted netlist from each subcell design that is within the local hierarchical database 345. These extracted netlist designs are located in the physical netlist 370 and are stored in a hierarchical format. At step 615 the LVS checker 375 is granted access to the portions of the physical netlist 370 which contain the netlist information for the overlap database 360 as extracted by the netlist extraction block 365. Lastly, at step 615, the LVS checker is granted access to the extracted netlist information representing the connectivity between subcells of the netlist and each new or unrecognized subcell design.

At step 620, the LVS checker 375 selects a first subcell design of the netlist. The subcell designs are selected by the LVS checker 375, in one embodiment, in the same order as they were selected with respect to process 500 of FIG. 6A. That is, leaf cells of a branch are selected first and the branch is walked upward to the root subcell design. At step 625, a check is made as to whether or not the name of the currently selected subcell design is located within the validation store 400. If so, then the LVS checker 375 assumes that the currently selected subcell design has already been LVS checked and at step 630 the next subcell design is obtained.

At step 625 of FIG. 7, if the currently selected subcell name is not in the validation store 400, then at step 635 (like step 520) all of the child subcell designs, and their child subcell design, etc., of the currently selected subcell are checked to see if any are located in the validation store 400. Any subcell design of the currently selected subcell design that is located in the validation store 400 is ignored by step 635 as being already validated through LVS checking. By ignoring validated subcell designs during the LVS checking process, the present invention reduces the required layout verification time.

At step 635, if a subcell design is not located in the validation store (e.g., it is unrecognized), then the its corresponding netlist information from the physical netlist 370 is then compared against the logical netlist 380 by the LVS checker 375 using well known methods and techniques. The LVS checker 375 checks for inconsistencies between the physical netlist 370 and the logical netlist 380. The point of the LVS checker 375 is to determine if the netlist information as extracted from the geometry data matches with the logical behavior of the logical netlist 380. Each unrecognized subcell at step 635 that checks out as being valid by the LVS checker 370 is then stored in a validated database 397 for the LVS checker and marked by the check-in block 395 for incorporation to the validation store 400 and is made available to the next layout verification pass. The above process continues until the last subcell design of the hierarchical tree has been processed by steps 625–635 upon which step 640 is entered.

At step 640 of FIG. 7, the present invention then obtains the physical netlist information that has been extracted from the overlap database 360. This physical netlist information is extracted by the netlist extraction block 365. At step 640, all of the extracted physical netlist information that originates from the determined overlap areas is provided to the LVS checker 375 for comparison against the logical netlist 380. Also at step 640 the connectivity information of the physical netlist 370 that corresponds to the connections to or from the new or unrecognized subcell designs is compared against the logical netlist 380. At step 645, if an LVS error is detected, then an error report is generated. If no LVS error is detected, then at 645 the netlist is layout verified, validated, and all subcell design information within the physical netlist is checked into the validation store 400 for use in a subsequent layout verification.

Composite Layout Verification Mode

FIG. 8A illustrates the process flow 660 for the composite layout verification user mode in accordance with the present invention. In composite layout verification mode, the present invention is only interested in performing layout verification on the overlap areas of the netlist as determined by overlap block 355. At step 665, if composite user mode is selected then step 670 is entered, else step 695 (FIG. 8B) is entered. At step 670 of FIG. 8A, the hierarchical checker 350 is used with overlap block 355 to determine only the overlap areas of the netlist in the manners described above. At step 675, the determined overlap areas are selectively flattened and stored in the overlap database 360. At step 680, the overlap area geometry is run through the design rule checker 425. At step 685, the overlap area is passed through the netlist extraction block 365 and its connectivity information is obtained. Also at step 685, the connectivity information from the netlist extraction block 365 is then passed through the LVS checker 375 and compared to the logical netlist 380. At step 690, the present invention generates a report on the results of the LVS checker 375 and the design rule checker 425. It the overlap areas passed as validated through both the LVS checker 375 and the design rule checker 425, the overlap area is validated and the composite layout verification is complete. If either the LVS checker 375 or the design rule checker 425 indicated an error, then a user readable error report is generated.

Leaf Cell Layout Verification Mode

FIG. 8B illustrates the process flow 692 for the leaf mode layout verification of the present invention. In this verification mode, only the leaf cells of the netlist are verified and no other subcell designs are processed. No overlap areas are processed during leaf cell verification mode. For instance, with reference to FIG. 2B, the leaf cells of hierarchical structure 150 are A1–A3, B1–B4, C1–C3 and D1. At step 705, the hierarchical checker 350 scans the hierarchical tree of the netlist and identifies those subcell designs that do not call other cells. These are the leaf cells. At step 710, each identified leaf cell is passed through the design rule checker 425 only if the leaf cell is not present within the validation store 400. If the leaf cell is present in the validation store 400 then it is ignored by the design rule checker 425 to decrease the required verification time.

At step 715 of FIG. 8B, each leaf cell that is not in the validation store 400 is also passed through the netlist extraction block 365 and stored in the physical netlist 370. This information is then compared by the LVS checker 375 against the logical netlist 380. At step 720, if the leaf cells of the netlist passed DRC validation, then the geometry information of each leaf cell that passed the design rule checker 425 is stored in the validation store 400 for use in a subsequent layout verification. Further, at step 720, if the leaf cells of the netlist passed LVS validation, then the connectivity information of each leaf cell that passed the LVS checker 375 is stored in the validation store 400 for use in a subsequent layout verification. At step 725 a user readable report is generated based on the results of the LVS checker 375 and the design rule checker 425.

FIG. 10 illustrates a diagram of leaf cells A1–A3 passing through layout verification 255, being verified and stored in the validation store 400. Upon a subsequent leaf cell layout verification mode, assuming these leaf cells are unchanged, they will be skipped by the DRC and LVS verification processes of the present invention thus decreasing the time required to check the entire netlist.

Design Rule Checker

The design rule checker 425 (FIG. 4B) of the present invention performs a number of checks regarding the geometry of CMOS (complementary metal oxide semiconductors) transistor elements, their contacts and conduction lines. The following figures describe the types of checks performed by the design rule checker 425. It is appreciated that the following checks are exemplary and that a variety of well known design rule checking processes can be used by design rule checker 425. Arrows between objects denote a minimum spacing and arrows showing the size of an object denote a minimum width. Spacing sizes are given in lambda units and this measurement is scaleable depending on the CMOS fabrication process used to implement the designs in the substrate.

Figure 11A:
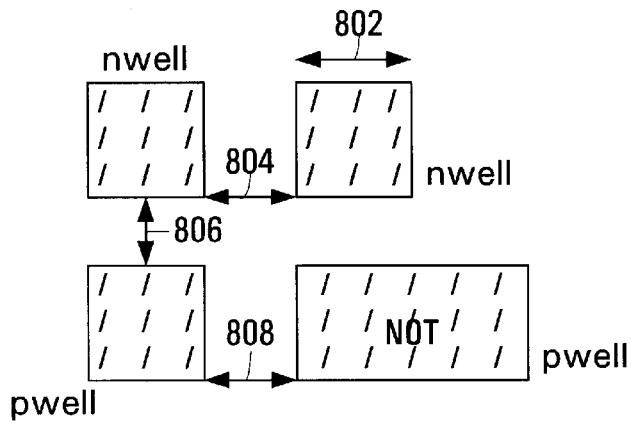
FIG. 11A, FIG. 11B and FIG. 11C illustrate certain design rules checked by the DRC of the present invention for CMOS wells, active areas and poly areas, respectively.
Figure 11B:
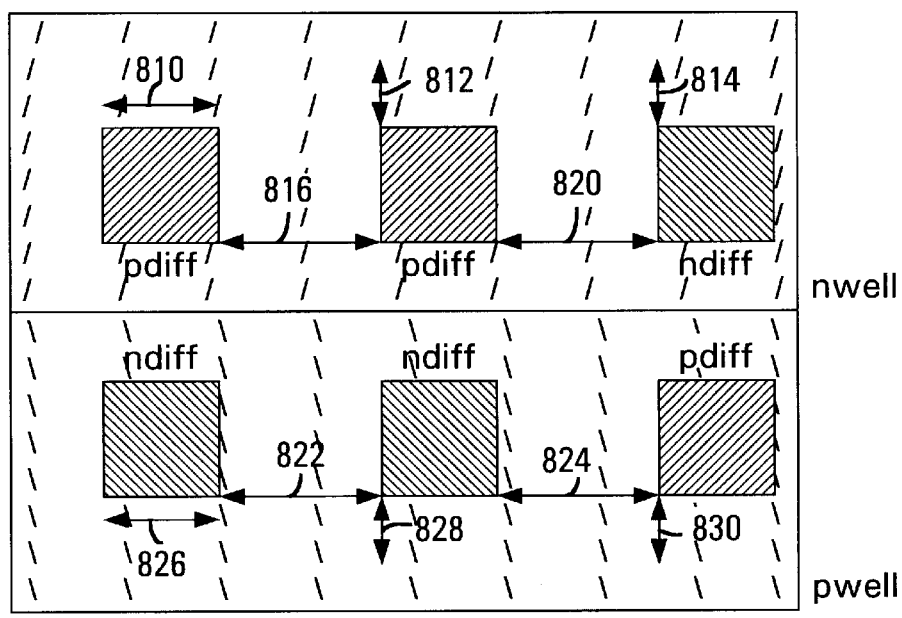
Figure 11C:
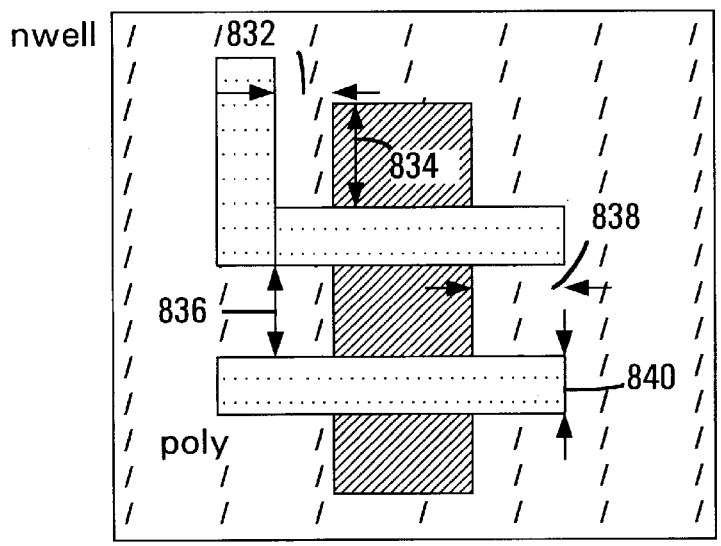

FIG. 11A, FIG. 11B and FIG. 11C illustrate certain design rules checked by the design rule checker 425 of the present invention for CMOS wells, active areas and poly areas, respectively. If any of the spacings/widths in this section are not met by a subdesign cell, an error condition is flagged by the design rule checker 425. Within FIG. 11A, information for well regions are given for MOSIS CWN and CWP masks. Minimum width 802 for each nwell is 10 lambdas. Minimum space 804 between nwells of different potential (a hot well) is 9 lambdas. Minimum space 806 between nwells of the same potential is from 0 to 6 lambdas. Minimum space 808 between different well types (pwell, nwell) is 0 lambda. Within FIG. 11B, information for active regions are given for MOSIS CAA masks. Minimum width 810/826 and minimum space 816/822 for active region (CAA) is 3 lambdas each. Spacing 812/828 from source/drain active to well edge spacing is 5 lambdas. Spacing 814/830 from substrate/well contact to active to well edge space is 3 lambdas. Spacing 820/824 is minimum spacing between active (different implant type) and is 0 or 4 lambdas. Within FIG. 11C, information regarding poly regions are given for MOSIS CPG masks. Width 840 and space 836 are each 3 lambdas. Space 838 is minimum gate extension of active and is 2 lambdas. The minimum active extension of poly is 834 and is 3 lambdas. The minimum field poly to active space is 832 and is 1 lambda. The design rule checker 425 checks each of the above spacings within its received geometry data.

Figure 12A:
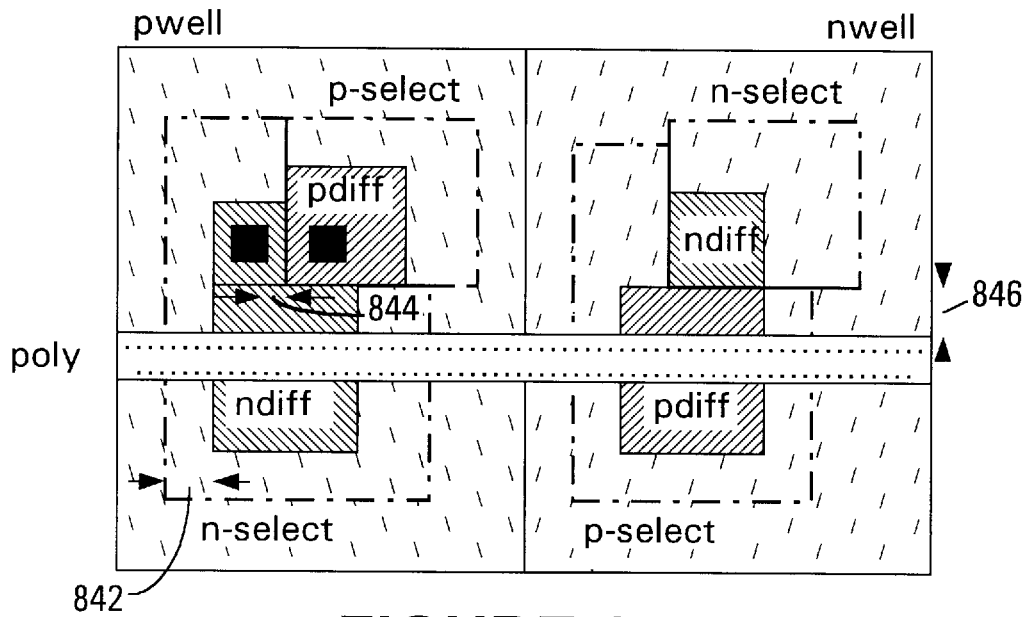
FIG. 12A, FIG. 12B and FIG. 12C illustrate certain design rules checked by the DRC of the present invention for CMOS select regions, poly contacts and active contacts, respectively.
Figure 12B:
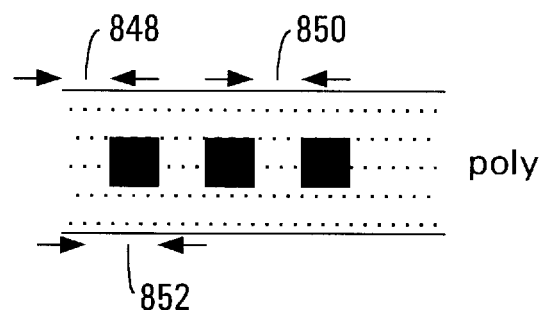
Figure 12C:
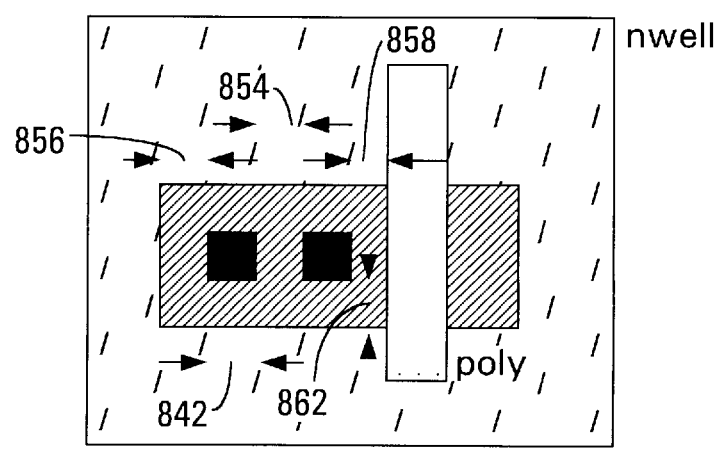

FIG. 12A, FIG. 12B and FIG. 12C illustrate certain design rules checked by the design rule checker 425 of the present invention for CMOS select regions, poly contacts and active contacts, respectively. FIG. 12A illustrates information for select regions for MOSIS CSN and CSP masks. The minimum select spacing 846 to channel of transistor is 3 lambdas. The minimum select overlap 842 of active is 2 lambdas. The minimum select overlap 844 of contact region is 1 lambda. FIG. 12B illustrates information for poly contact regions for MOSIS CCP masks. Space 852 is the exact contact size and is 2×2 lambda, space 848 is the minimum poly overlap and is 1.5 lambda and space 850 is the minimum contact spacing at 2 lambda. FIG. 12C illustrates spacings for active contact regions and space 860 is the exact contact size (2×2 lambda), space 862/856 is the minimum active overlap (1.5 lambda), space 854 is the minimum contact spacing (2 lambda) and space 858 is the minimum space to gate of transistor (2 lambda).

Figure 13A:
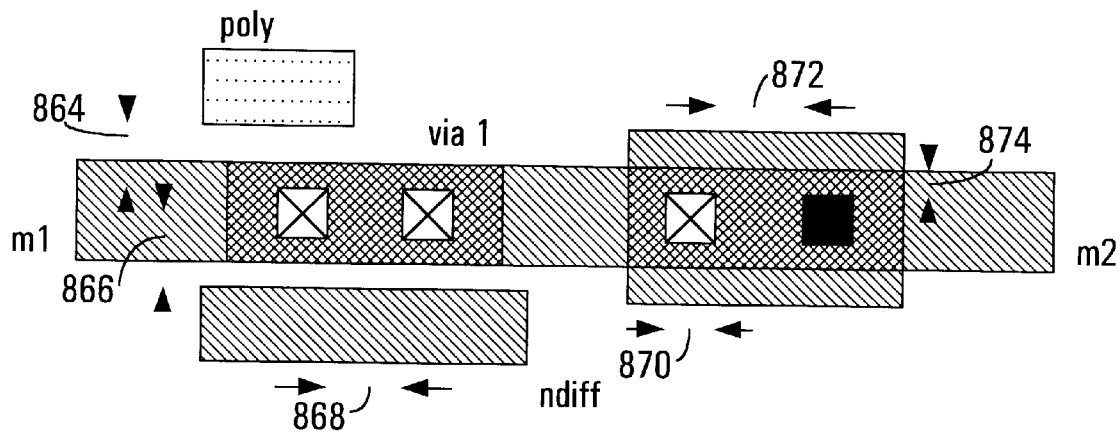
FIG. 13A, FIG. 13B and FIG. 13C illustrate certain design rules checked by the DRC of the present invention for CMOS via1 regions, metal1 regions and metal2 regions, respectively.
Figure 13B:
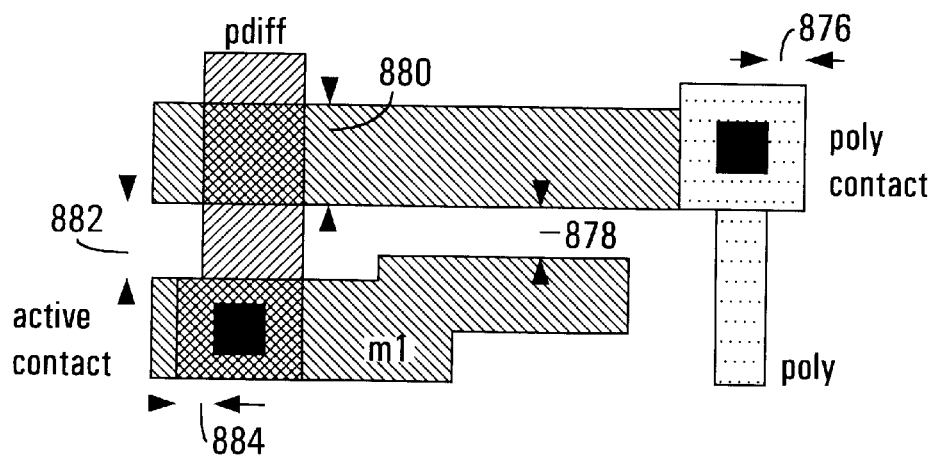
Figure 13C:
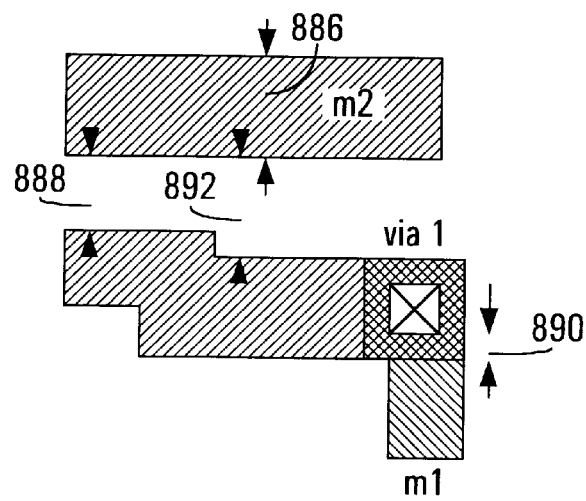

FIG. 13A, FIG. 13B and FIG. 13C illustrate certain design rules checked by the design rule checker 425 of the present invention for CMOS via 1 regions, metal1 regions and metal2 regions, respectively. FIG. 13A illustrates spacings for via1 regions and 870 is the exact size (2×2 lambda), 868 is the minimum via spacing (3 lambda), 874 is the minimum overlap by metal 1 (1 lambda), 872 is the minimum spacing to contact (2 lambda) and 864/866 is the minimum spacing to poly or active edge (2 lambda each). FIG. 13B illustrates spacings for metal1 regions, 880 is the minimum width (3 lambda), 882 is the minimum space (3 lambda), 878 is the minimum space for minimum-width wires only (2 lambda), 876 is the minimum overlap of poly contact (1 lambda) and 884 is the minimum overlap of active contact (1 lambda). FIG. 13C illustrates spacings for metal2, 886 is the minimum width (3 lambdas), 892 is the minimum space (4 lambdas), 888 is the minimum space for minimum-width wires only (3 lambdas) and 890 is the minimum overlap of via1 (1 lambda).

Figure 14A:
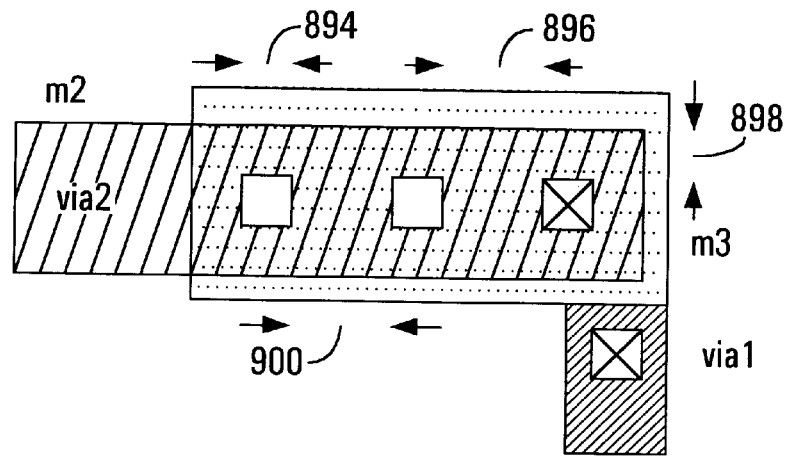
FIG. 14A, FIG. 14B and FIG. 14C illustrate certain design rules checked by the DRC of the present invention for CMOS via2 regions, metal3 and overglass regions, respectively.
Figure 14B:
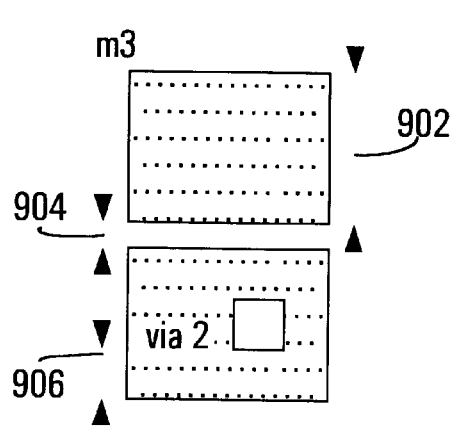
Figure 14C:
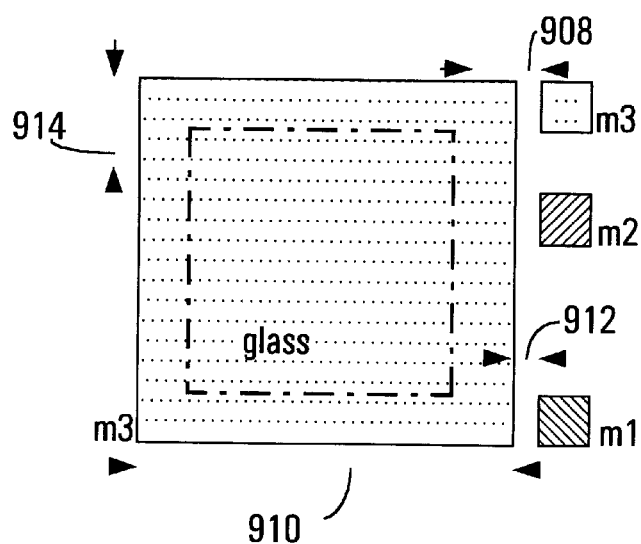

FIG. 14A, FIG. 14B and FIG. 14C illustrate certain design rules checked by the design rule checker 425 of the present invention for CMOS via2 regions, metal3 and overglass regions, respectively. FIG. 14A illustrates spacings for via2 and 894 is the exact size (2×2 lambda), 900 is the minimum space (3 lambdas), 898 is the minimum overlap by metal2 (1 lambda) and 896 is the minimum spacing to via1 (2 lambdas). FIG. 14B illustrates spacings for metal3 and 902 is the minimum width (6 lambdas), 904 is the minimum spacings (4 lambdas) and 906 is the minimum overlap of via2 (2 lambdas). FIG. 14C illustrates the spacings for overglass in microns where 910 is 100×100, space 914 is 6 microns, 908 is 30 microns and 912 is 15 microns. As stated previously, the design rule checker 425 checks each of the above spacings/widths within its received geometry data and reports errors for any measurements that are not satisfied.

Conclusion

The preferred embodiment of the present invention, a system for performing layout verification that reuses previously validated subcell designs, is thus described. While the present invention has been described in particular embodiments, it should be appreciated that the present invention should not be construed as limited by such embodiments, but rather construed according to the below claims.

What is claimed is:

1. A computer implemented method of verifying an integrated circuit design layout, said computer implemented method comprising the steps of:

a) receiving a stream of layout information representing said integrated circuit layout design, said stream of information comprising a plurality of subcell designs having parent-child relationships;

b) comparing names of said subcell designs against a history database and parsing and storing into a new database only those subcell designs that are not found within said history database, said history database representing previously parsed subcell designs;

c) from said new and history databases, constructing a hierarchical tree of said subcell designs from said parent-child relationships;

d) selecting a selected subcell design from said hierarchical tree;

e) performing design rule verification on said selected subcell design only if said selected subcell design is not indicated within a validation store;

f) performing steps d)–e) for each subcell design of said hierarchical tree and generating a design rule verification report on said integrated circuit design layout; and g) storing into said validation store the geometry of each subcell design selected at step d) that passed design rule verification.

2. A method as described in claim 1 wherein said stream of layout information is represented presented in the Graphic Design Stream (GDSII) format.

3. A method as described in claim 1 wherein said step e) also comprises the step of performing netlist extraction on each subcell design that is not indicated within said validation store to obtain a netlist of said subcell design and storing each netlist into a physical netlist database.

4. A method as described in claim 3 further comprising the steps of:

h) selecting a selected subcell design from said hierarchical tree;

i) using a layout versus schematic checker to compare an extracted netlist corresponding to said selected subcell design of said physical netlist database to a logical netlist database of said selected subcell design; and j) performing steps h)–i) for each subcell design of said hierarchical tree and generating a layout versus schematic verification report on said integrated circuit layout design; and k) storing into said validation store netlist information of each subcell design selected at step h) that passed layout versus schematic verification.

5. A method as described in claim 1 further comprising the steps of:

performing netlist extraction on a parent subdesign of each unrecognized subcell design of said hierarchical tree to obtain connectivity data on each input/output port of said unrecognized subcell design, an unrecognized subcell design being a subcell design that is not indicated within said validation store; and performing layout versus schematic verification on said connectivity data against a logical netlist database.

6. A method as described in claim 1 further comprising the steps of:

determining areas of overlap between said subcell designs of said hierarchical tree;

flattening said areas of overlap and storing any flattened data into a flattened database;

performing design rule verification on said flattened data;

performing netlist extraction on said flattened data to obtain netlist data on said areas of overlap; and performing layout versus schematic verification on said netlist data of said areas of overlap.

7. A method as described in claim 6 wherein said step of determining areas of overlap comprises the step of determining areas of overlap between a subdesign that is indicated within said validation store and a subdesign that is not indicated within said validation store.

8. A method as described in claim 1 wherein step e) comprises the steps of:

provided said selected subcell design is not indicated within said validation store, searching all child subcell designs of said selected subcell design to determine whether or not said child subcell designs are indicated within said validation store; and performing design rule verification only on child subcell designs of said selected subcell design that are not indicated within said validation store.

9. A computer system comprising a processor coupled to a bus and a computer readable memory unit coupled to said bus wherein said computer readable memory unit contains instructions stored therein that when executed by said processor cause said computer system to implement a method of verifying the an integrated circuit layout design, said method comprising the steps of:

a) receiving a stream of layout information representing said integrated circuit layout design, said stream of information comprising a plurality of subcell designs having parent-child relationships;

b) comparing names of said subcell designs against a history database and parsing and storing into a new database only those subcell designs that are not found within said history database, said history database representing previously parsed subcell designs;

c) from said new and history databases, constructing a hierarchical tree of said subcell designs from said parent-child relationships;

d) selecting a selected subcell design from said hierarchical tree;

e) performing design rule verification on said selected subcell design only if said selected subcell design is not indicated within a validation store;

f) performing steps d)–e) for each subcell design of said hierarchical tree and generating a design rule verification report on said integrated circuit design layout; and g) storing into said validation store the geometry of each subcell design selected at step d) that passed design rule verification.

10. A computer system as described in claim 9 wherein said stream of layout information is represented in the Graphic Design Stream (GDSII) format.

11. A computer system as described in claim 9 wherein said step e) also comprises the step of performing netlist extraction on each subcell design that is not indicated within said validation store to obtain a netlist of said subcell design and storing each netlist into a physical netlist database.

12. A computer system as described in claim 11 wherein said method further comprises the steps of:

h) selecting a selected subcell design from said hierarchical tree;

i) using a layout versus schematic checker to compare an extracted netlist corresponding to said selected subcell design of said physical netlist database to a logical netlist database of said selected subcell design; and j) performing steps h)–i) for each subcell design of said hierarchical tree and generating a layout versus schematic verification report on said integrated circuit layout design; and k) storing into said validation store netlist information of each subcell design selected at step h) that passed layout versus schematic verification.

13. A computer system as described in claim 9 wherein said method further comprising the steps of:

performing netlist extraction on a parent subdesign of each unrecognized subcell design of said hierarchical tree to obtain connectivity data on each input/output port of said unrecognized subcell design, an unrecognized subcell design being a subcell design that is not indicated within said validation store; and performing layout versus schematic verification on said connectivity data against a logical netlist database.

14. A computer system as described in claim 9 wherein said method further comprising the steps of:

determining areas of overlap between said subcell designs of said hierarchical tree;

flattening said areas of overlap and storing any flattened data into a flattened database;

performing design rule verification on said flattened data;

performing netlist extraction on said flattened data to obtain netlist data on said areas of overlap; and performing layout versus schematic verification on said netlist data of said areas of overlap.

15. A computer system as described in claim 14 wherein said step of determining areas of overlap comprises the step of determining areas of overlap between a subdesign that is indicated within said validation store and a subdesign that is not indicated within said validation store.

16. A computer system as described in claim 9 wherein step e) comprises the steps of:

provided said selected subcell design is not indicated within said validation store, searching all child subcell designs of said selected subcell design to determine whether or not said child subcell designs are indicated within said validation store; and performing design rule verification only on child subcell designs of said selected subcell design that are not indicated within said validation store.

17. A computer implemented method of verifying an integrated circuit layout design, said method comprising the steps of:
  a) constructing a hierarchical tree of subcell designs from parent-child relationships between said subcell designs, said subcell designs representing said integrated circuit layout design, said step a) comprising the step of comparing names of said subcell designs against a history database and parsing and storing into a new database only those subcell designs that are not found within said history database, said history database representing previously parsed subcell designs;
  b) selecting a selected subcell design from said hierarchical tree;
  c) performing design rule verification and netlist extraction on said selected subcell design only if said selected subcell design is not indicated within a validation store, said netlist extraction generating a netlist of said selected subcell design;
  d) performing steps b)–c) for each subcell design of said hierarchical tree and generating a design rule verification report on said integrated circuit layout design;
  e) storing into said validation store geometry data of each subcell design selected at step b) that passed design rule verification;
  f) selecting a selected subcell design from said hierarchical tree;
  g) using a layout versus schematic checker to compare an extracted netlist corresponding to said selected subcell design to a logical netlist representation of said selected subcell design; and
  h) performing steps f)–g) for each subcell design of said hierarchical tree and generating a layout versus schematic verification report on said integrated circuit layout design; and
  i) storing into said validation store said extracted netlist of each subdesign selected at step f) that passed layout versus schematic verification.

18. A method as described in claim 17 wherein said step a) further comprises the steps of:
  receiving a stream of layout information representing said integrated circuit layout design, said stream of information comprising said subcell designs which have parent-child relationships;
  from said new and history databases, constructing said hierarchical tree of subcell designs from said parent-child.

19. A method as described in claim 18 wherein said stream of layout information is represented in the Graphic Design Stream (GDSII) format.

20. A method as described in claim 17 further comprising the steps of:
  performing netlist extraction on a parent subdesign of each unrecognized subcell design of said hierarchical tree to obtain connectivity data on each input/output port of said unrecognized subcell design, an unrecognized subcell design being a subcell design that is not indicated within said validation store; and
  performing layout versus schematic verification on said connectivity data against a logical netlist database.

21. A method as described in claim 17 further comprising the steps of:
  determining areas of overlap between said subcell designs of said hierarchical tree;
  flattening said areas of overlap and storing any flattened data into a flattened database;
  performing design rule verification on said flattened data;
  performing netlist extraction on said flattened data to obtain netlist data on said areas of overlap; and
  performing layout versus schematic verification on said netlist data of said areas of overlap.

22. A method as described in claim 17 wherein step c) comprises the steps of:
  provided said selected subcell design is not indicated within said validation store, searching all child subcell designs of said selected subcell design to determine whether or not said child subcell designs are indicated within said validation store; and
  performing design rule verification only on child subcell designs of said selected subcell design that are not indicated within said validation store.

* * * * *